US012811099B2

(12) United States Patent
Nagashima et al.

(10) Patent No.: US 12,811,099 B2
(45) Date of Patent: Nov. 24, 2026

(54) PLASMA PROCESSING APPARATUS

(71) Applicant: Tokyo Electron Limited, Tokyo (JP)

(72) Inventors: Nozomu Nagashima, Miyagi (JP); Daisuke Yoshikoshi, Miyagi (JP); Kunihiko Yamagata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 58 days.

(21) Appl. No.: 19/000,712

(22) Filed: Dec. 24, 2024

(65) Prior Publication Data

US 2025/0132130 A1 Apr. 24, 2025

Related U.S. Application Data

(63) Continuation of application No. PCT/JP2023/020311, filed on May 31, 2023.

(60) Provisional application No. 63/356,713, filed on Jun. 29, 2022.

(51) Int. Cl.
*H01J 37/32* (2006.01)

(52) U.S. Cl.
CPC .................. *H01J 37/32174* (2013.01); *H01J 37/32091* (2013.01); *H01J 37/3211* (2013.01); *H01J 37/32146* (2013.01); *H01J 37/32568* (2013.01); *H01J 37/32651* (2013.01); *H01J 2237/334* (2013.01)

(58) Field of Classification Search
None
See application file for complete search history.

(56) References Cited

U.S. PATENT DOCUMENTS

2015/0138031 A1 5/2015 Van Gils et al.
2024/0170258 A1* 5/2024 Tamamushi ...... H01J 37/32183

FOREIGN PATENT DOCUMENTS

| | | | |
|---|---|---|---|
| JP | 2013055129 | A | 3/2013 |
| JP | 2015-173027 | A | 10/2015 |
| JP | 2017054646 | A | 3/2017 |
| WO | 2014132518 | A1 | 9/2014 |

OTHER PUBLICATIONS

International Search Report and Written Opinion mailed on Jul. 18, 2023, received for PCT Application PCT/JP2023/020311, filed on May 31, 2023, 8 pages including English Translation.

* cited by examiner

*Primary Examiner* — Kenneth B Wells
(74) *Attorney, Agent, or Firm* — XSENSUS LLP

(57) ABSTRACT

A plasma processing apparatus comprises a first plasma processing apparatus and a second plasma processing apparatus. Each of the first plasma processing apparatus and the second plasma processing apparatus comprises a plasma processing chamber, a substrate support, a high frequency power supply, an electrode or an antenna, a power consuming member, a ground frame, an electricity storage unit, a power receiving coil and a rectifying and smoothing unit. The ground frame is grounded and surrounding the substrate support together with the plasma processing chamber. Each of the first plasma processing apparatus and the second plasma processing apparatus is configured such that, with respect to the power consuming member thereof, the electricity storage unit thereof and the electricity storage unit of a remaining one of the first plasma processing apparatus and the second plasma processing apparatus are connectable in parallel.

10 Claims, 36 Drawing Sheets

PLASMA PROCESSING APPARATUS

CROSS-REFERENCE TO RELATED APPLICATIONS

This application is a continuation application of International Application No. PCT/JP2023/020311 having an international filing date of May 31, 2023 and designating the United States, the International Application being based upon and claiming the benefit of priority from the U.S. Provisional Patent Application No. 63/356,713 filed on Jun. 29, 2022, the entire contents of each are incorporated herein by reference.

TECHNICAL FIELD

An exemplary embodiment of the present disclosure relates to a plasma processing apparatus.

BACKGROUND

A plasma processing apparatus is used in plasma processing. The plasma processing apparatus includes a chamber and a substrate support (mounting table) disposed within the chamber. The substrate support has a base (lower electrode) and an electrostatic chuck that holds a substrate. A temperature adjustment element (for example, a heater) for adjusting the temperature of the substrate is provided inside the electrostatic chuck. In addition, a filter is provided between the temperature adjustment element and a power supply for the temperature adjustment element to attenuate or block high frequency noise entering lines such as power-feeding lines and/or signal wires from high frequency electrodes and/or other electrical members within the chamber. One type of such plasma processing apparatus is disclosed in Japanese Laid-open Patent Publication No. 2015-173027.

SUMMARY

An exemplary embodiment of the present disclosure provides a technology for reducing a fluctuation of an output voltage in response to a load fluctuation of an electricity storage unit of a plasma processing apparatus.

According to an exemplary embodiment, a plasma processing apparatus is provided. The plasma processing apparatus comprises a first plasma processing apparatus and a second plasma processing apparatus. Each of the first plasma processing apparatus and the second plasma processing apparatus comprises a plasma processing chamber, a substrate support, a high frequency power supply, an electrode or an antenna, a power consuming member, a ground frame, an electricity storage unit, a power receiving coil and a rectifying and smoothing unit. The substrate support is disposed within the plasma processing chamber. The high frequency power supply is configured to generate high frequency power. The electrode or the antenna is electrically connected to the high frequency power supply to receive the high frequency power for generating plasma from gas within the plasma processing chamber. The power consuming member is disposed within the plasma processing chamber or the substrate support. The ground frame is grounded and surrounds the substrate support together with the plasma processing chamber. The electricity storage unit is disposed within a space surrounded by the ground frame and electrically connected to the power consuming member. The power receiving coil is electrically connected to the electricity storage unit and capable of receiving power from a power transmitting coil by electromagnetic induction coupling. The rectifying and smoothing unit is disposed within the space surrounded by the ground frame, and comprises a rectifying circuit connected to the power receiving coil, and a smoothing circuit connected between the rectifying circuit and the electricity storage unit. Each of the first plasma processing apparatus and the second plasma processing apparatus is configured such that, with respect to the power consuming member thereof, the electricity storage unit thereof and the electricity storage unit of the other one of the first plasma processing apparatus and the second plasma processing apparatus are connectable in parallel.

Figure 23A:
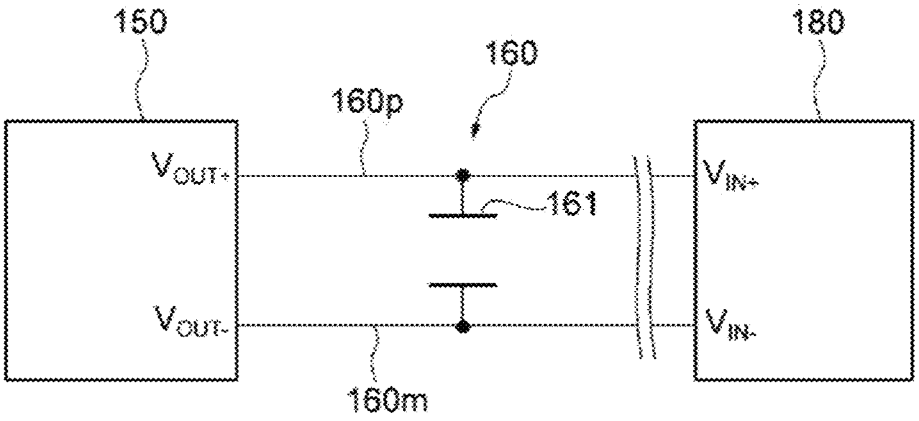
Figure 23B:
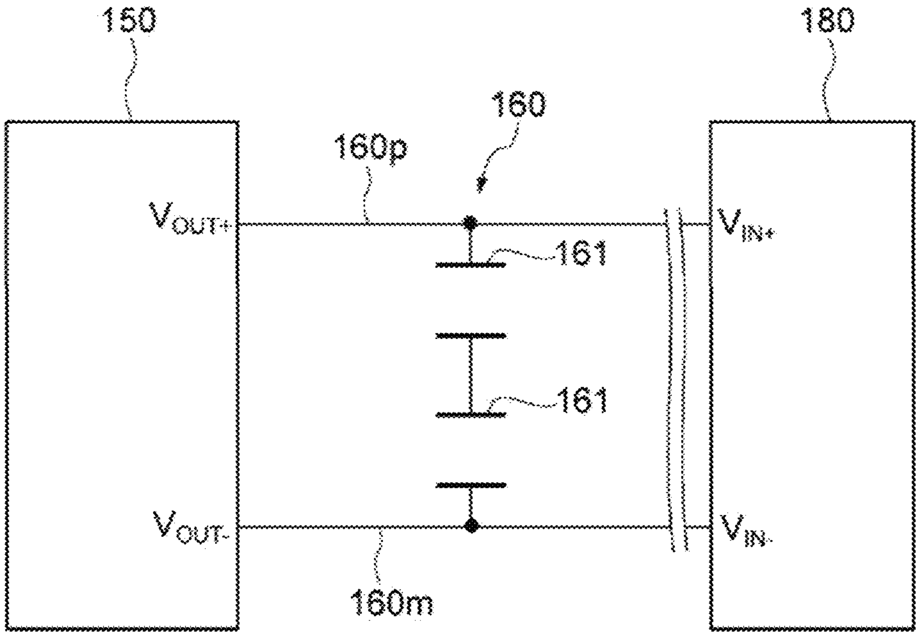

Each of FIGS. 23A and 23B is a diagram illustrating an electricity storage unit according to one exemplary embodiment.

Figure 24:
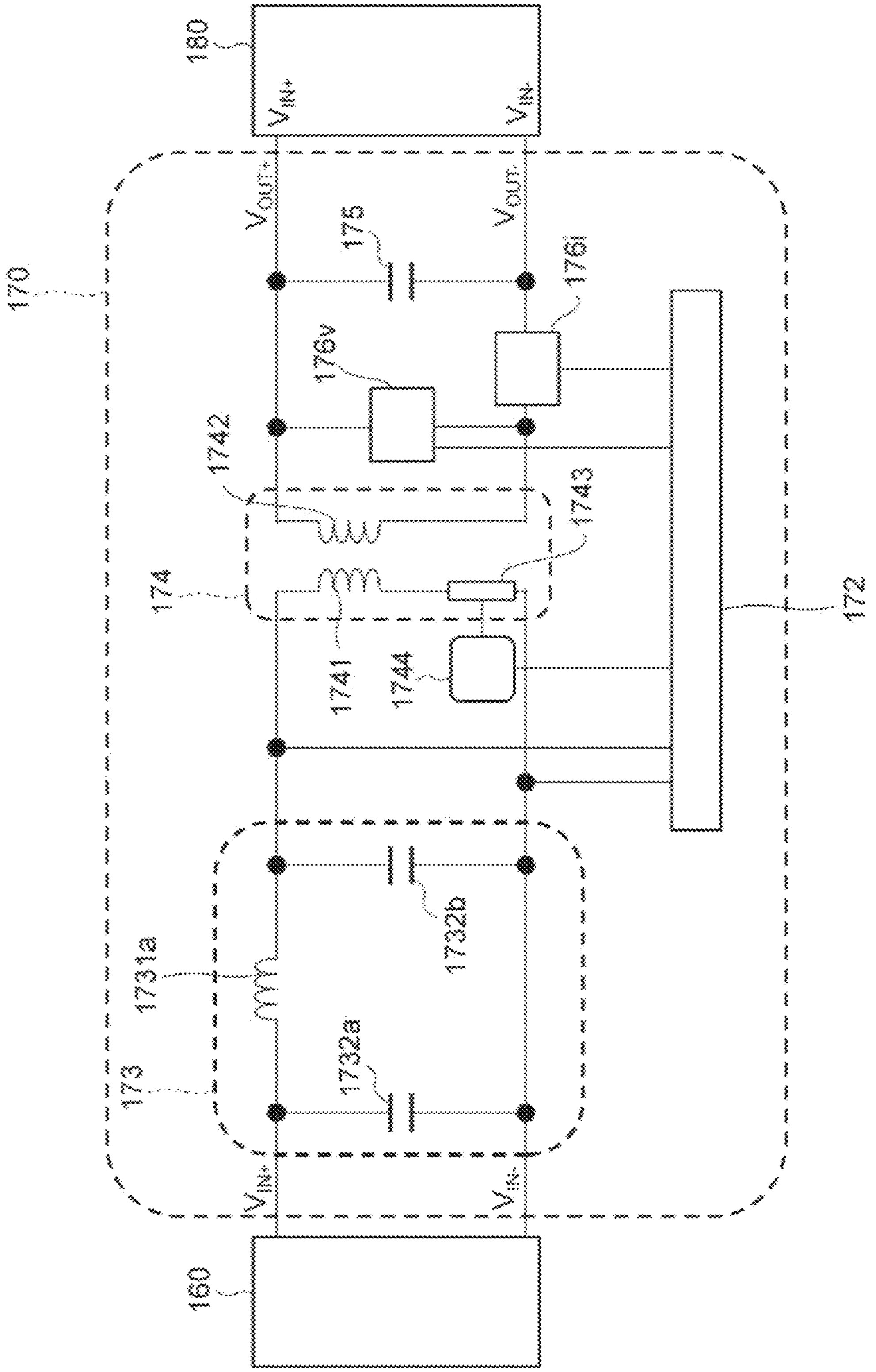

FIG. 24 is a diagram illustrating a voltage control converter according to one exemplary embodiment.

Figure 25:
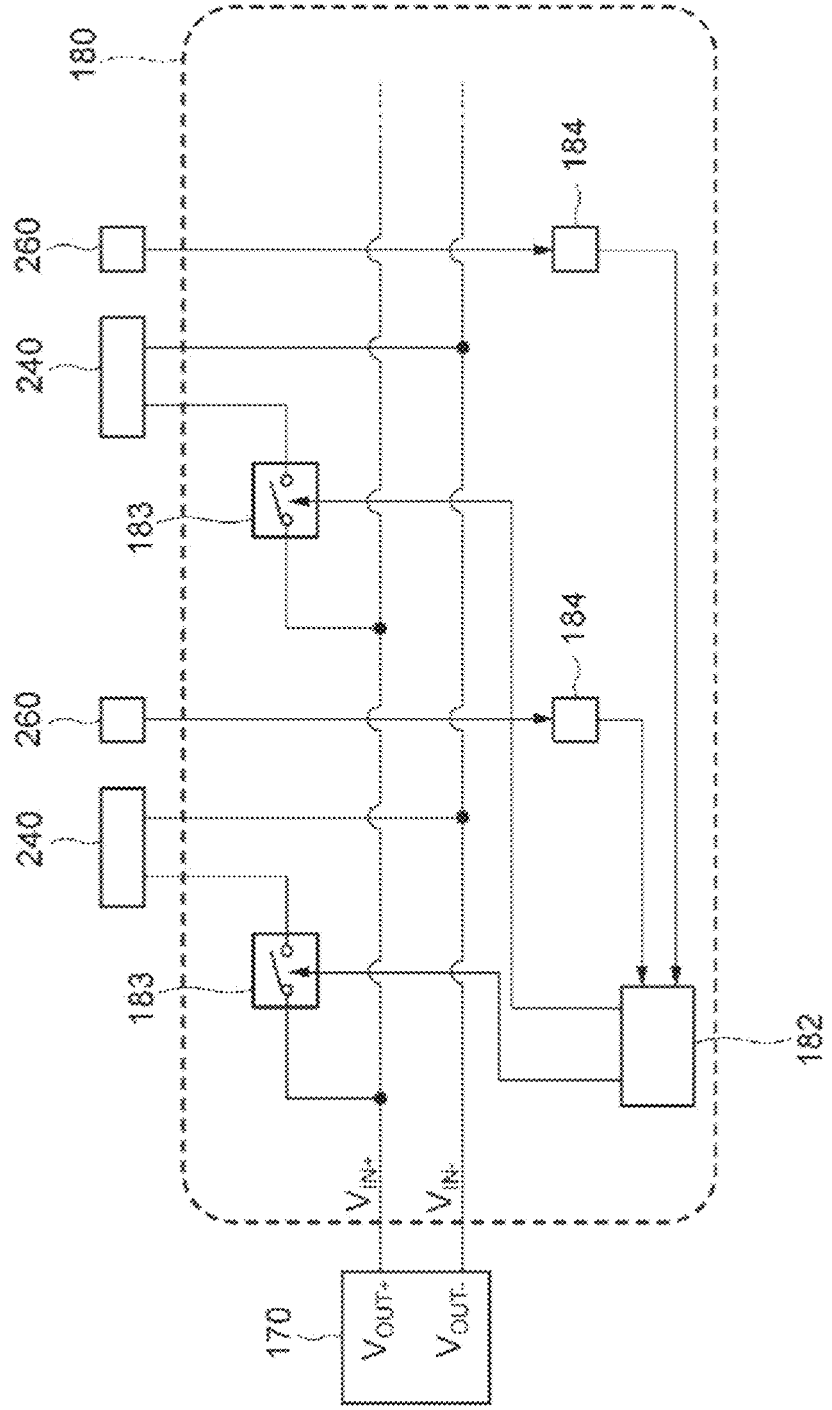

FIG. 25 is a diagram illustrating a constant voltage controller according to one exemplary embodiment.

Figure 26:
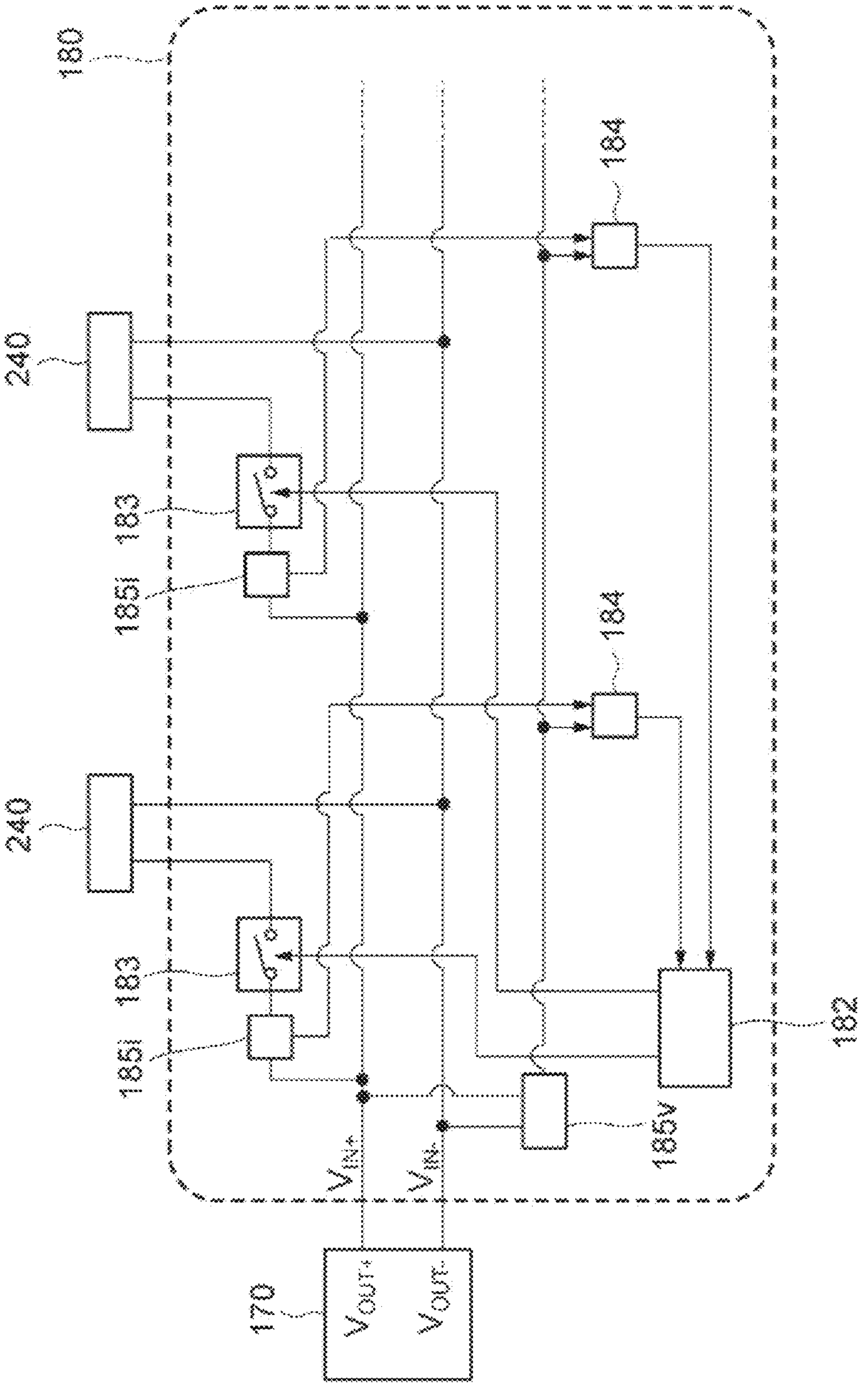

FIG. 26 is a diagram illustrating a constant voltage controller according to another exemplary embodiment.

Figure 27:
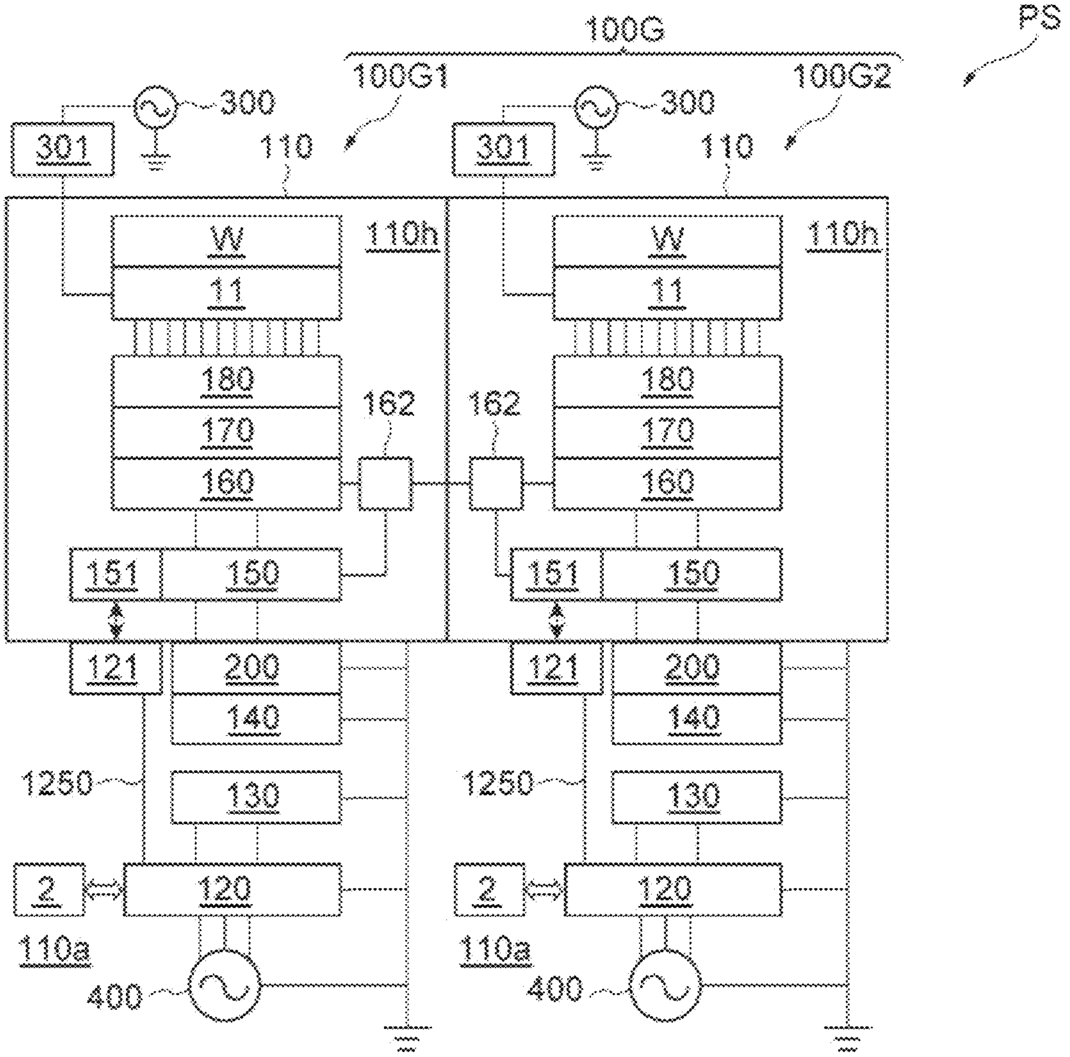

FIG. 27 is a diagram illustrating a plasma processing system according to one exemplary embodiment.

Figure 28:
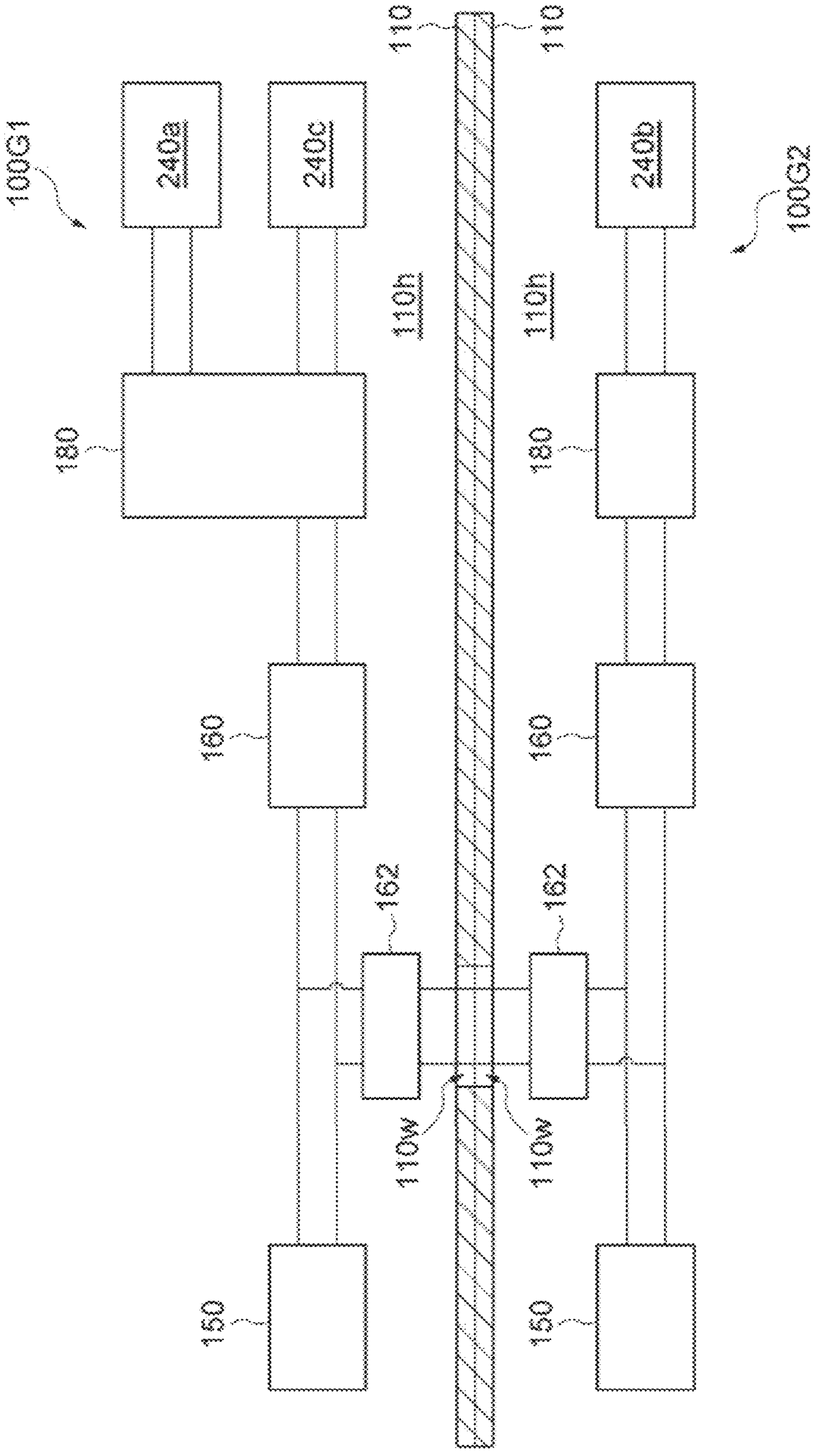

FIG. 28 is a diagram partially illustrating the configuration of a plasma processing system according to one exemplary embodiment.

Figure 29:
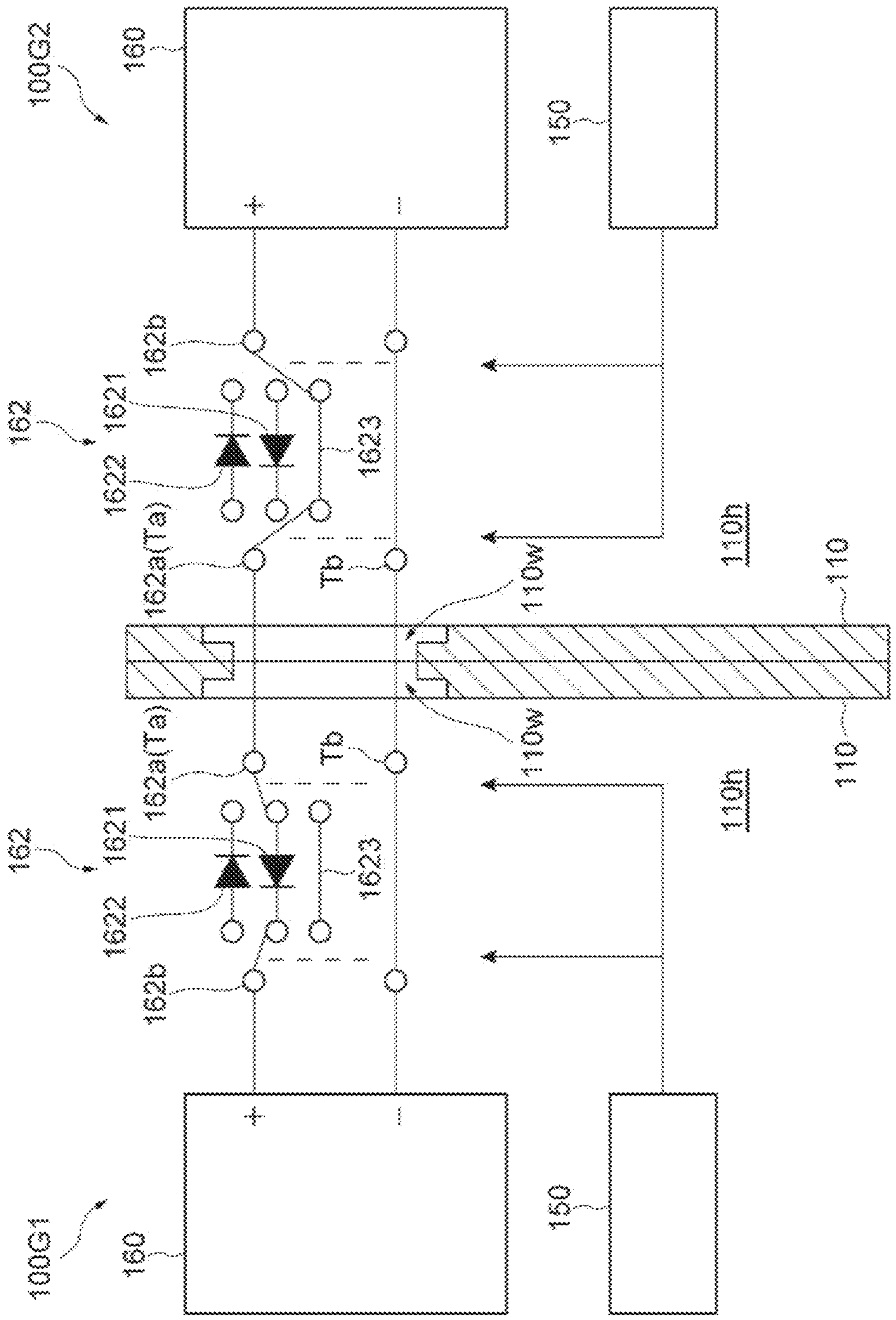

FIG. 29 is a diagram partially illustrating the configuration of a plasma processing system according to one exemplary embodiment.

Figure 30:
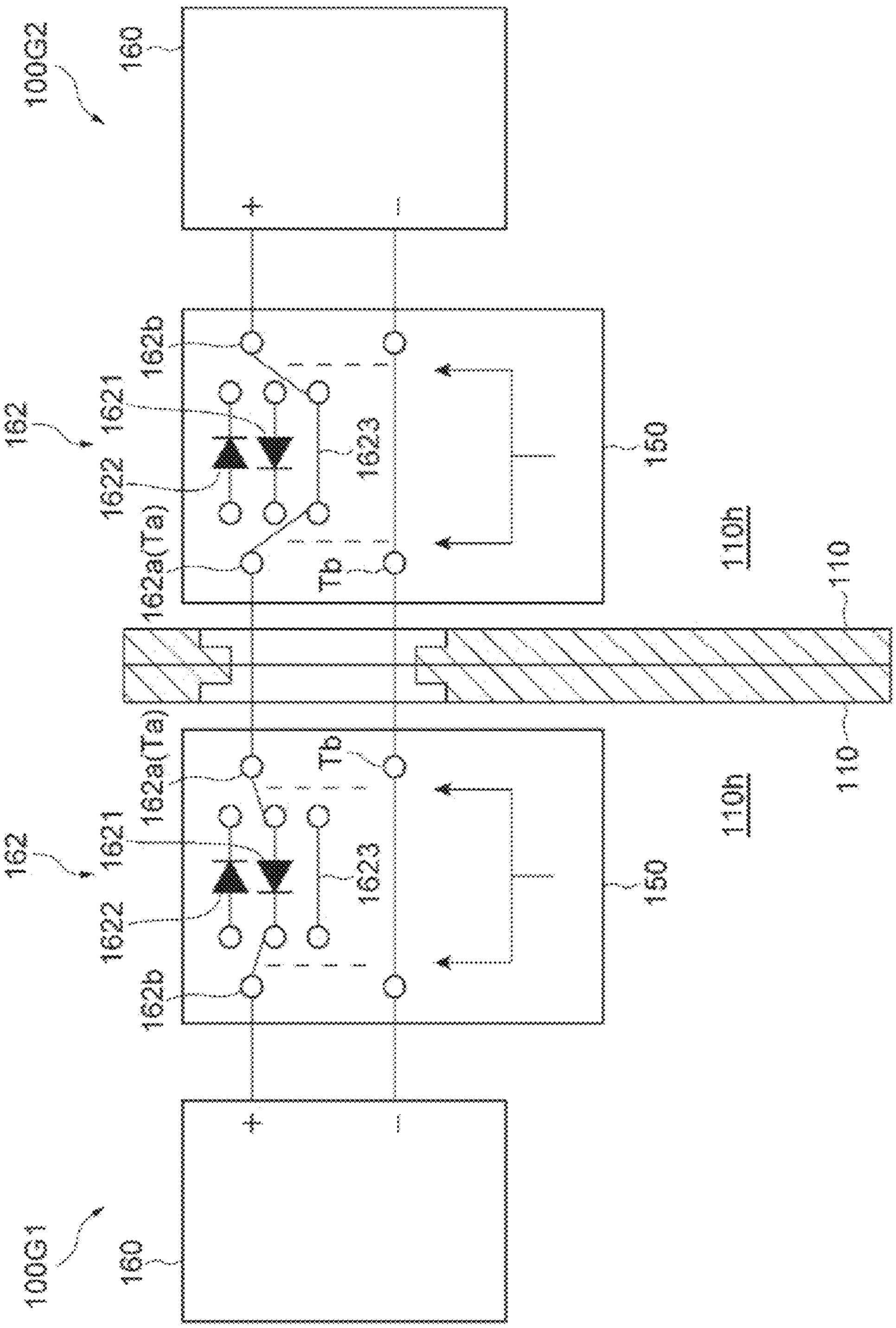

FIG. 30 is a diagram partially illustrating the configuration of a plasma processing system according to one exemplary embodiment.

Figure 31:
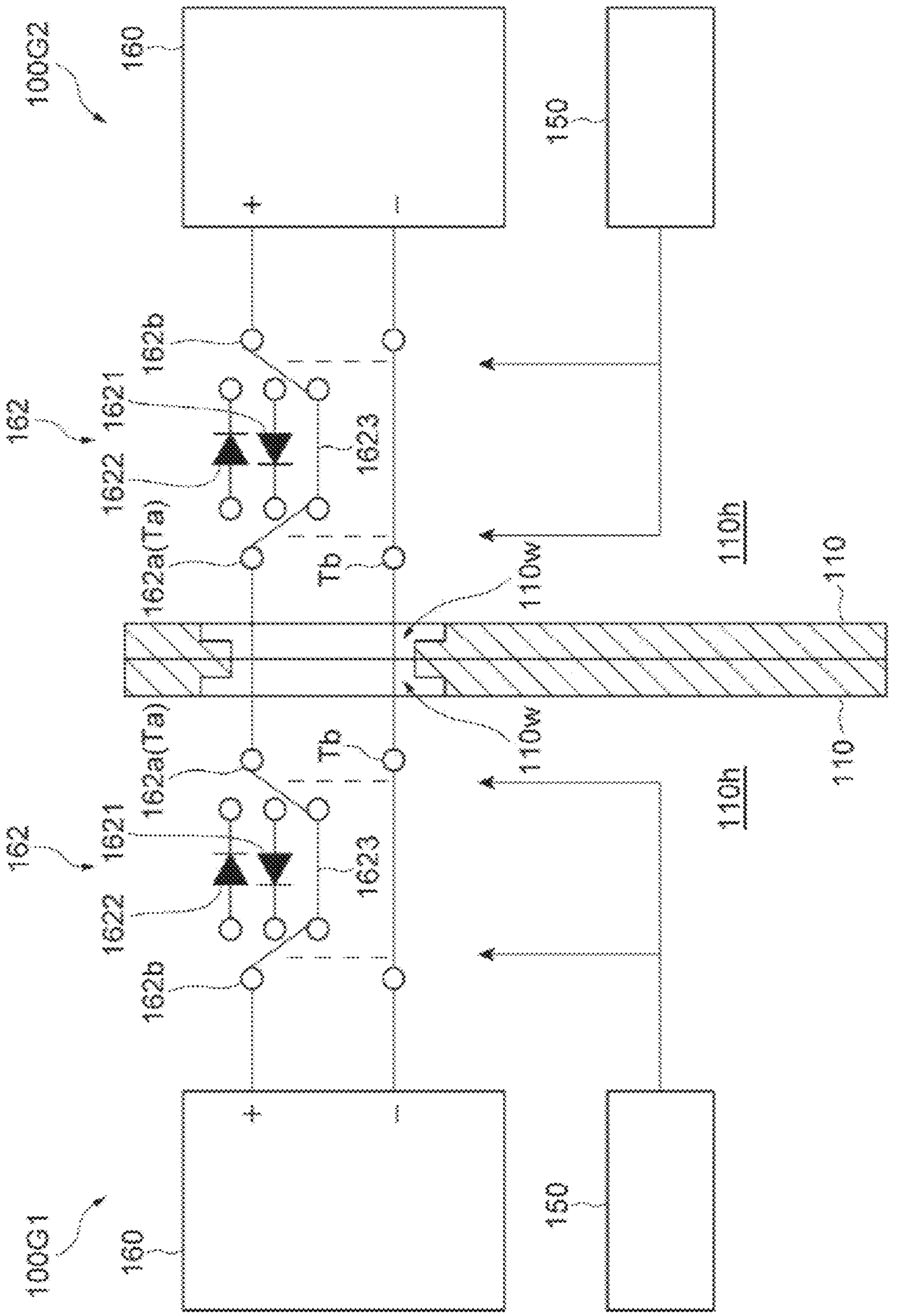

FIG. 31 is a diagram partially illustrating the configuration of a plasma processing system according to one exemplary embodiment.

Figure 32:
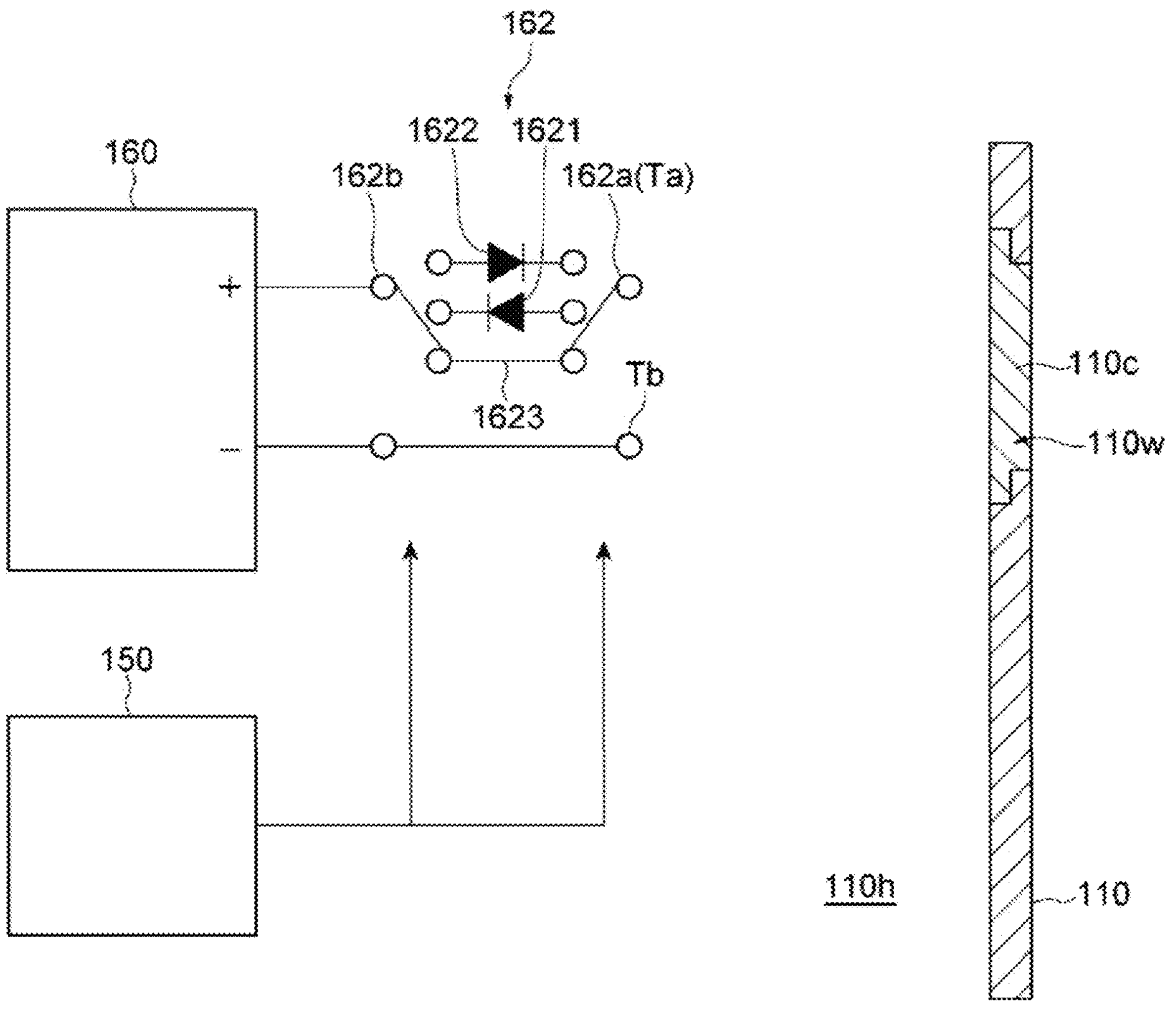

FIG. 32 is a diagram partially illustrating the configuration of a plasma processing system according to one exemplary embodiment.

Figure 33:
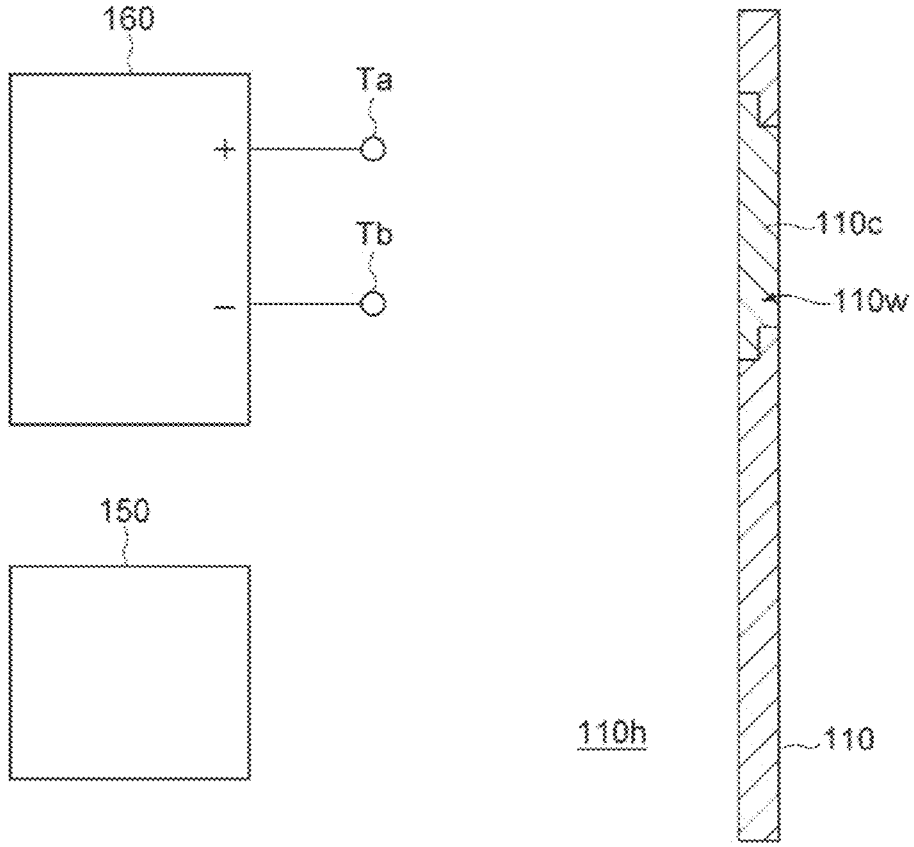

FIG. 33 is a diagram partially illustrating the configuration of a plasma processing system according to one exemplary embodiment.

Figure 34:
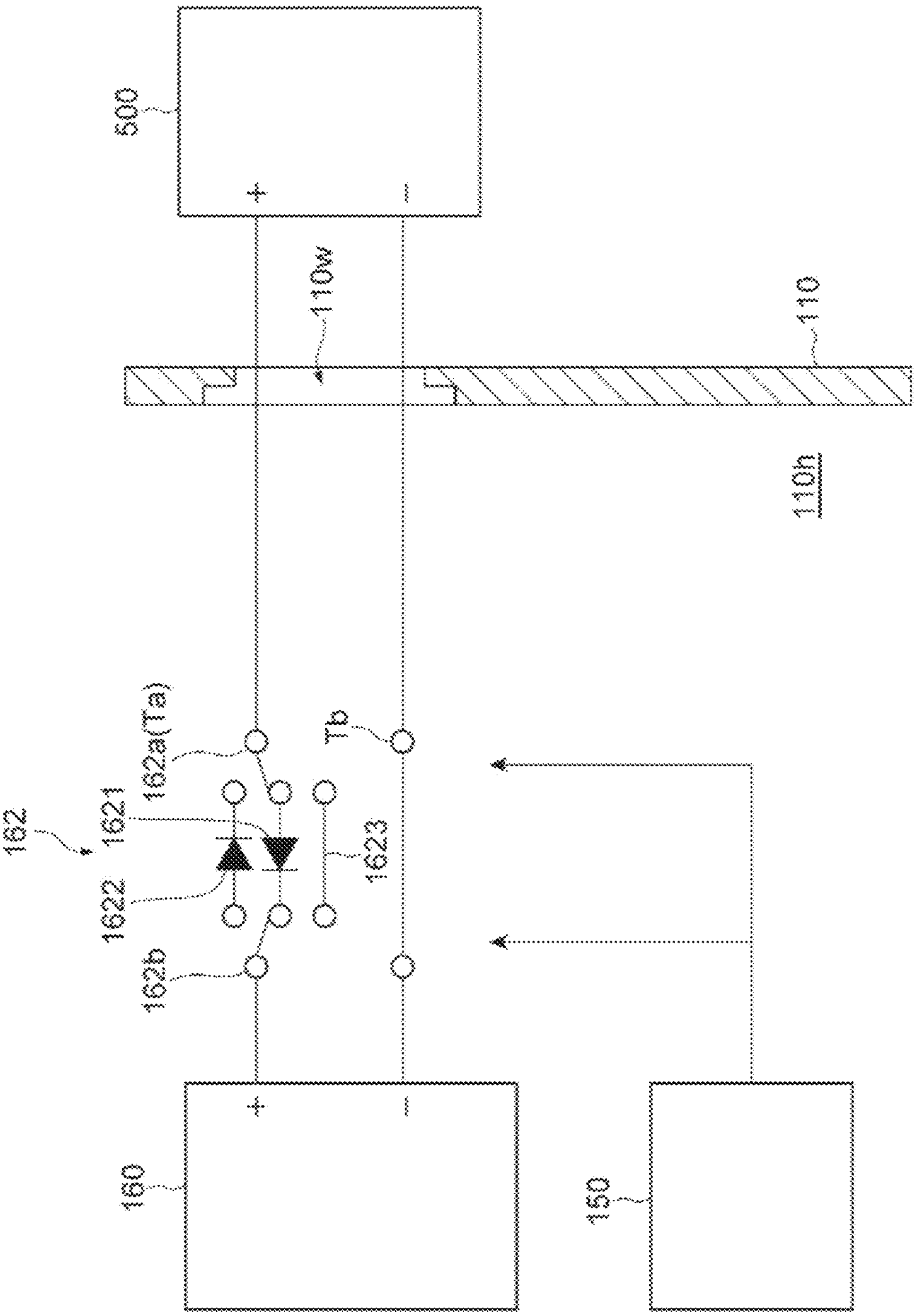

FIG. 34 is a diagram illustrating a state in which an electricity storage unit in a plasma processing system according to one exemplary embodiment is charged.

Figure 35:
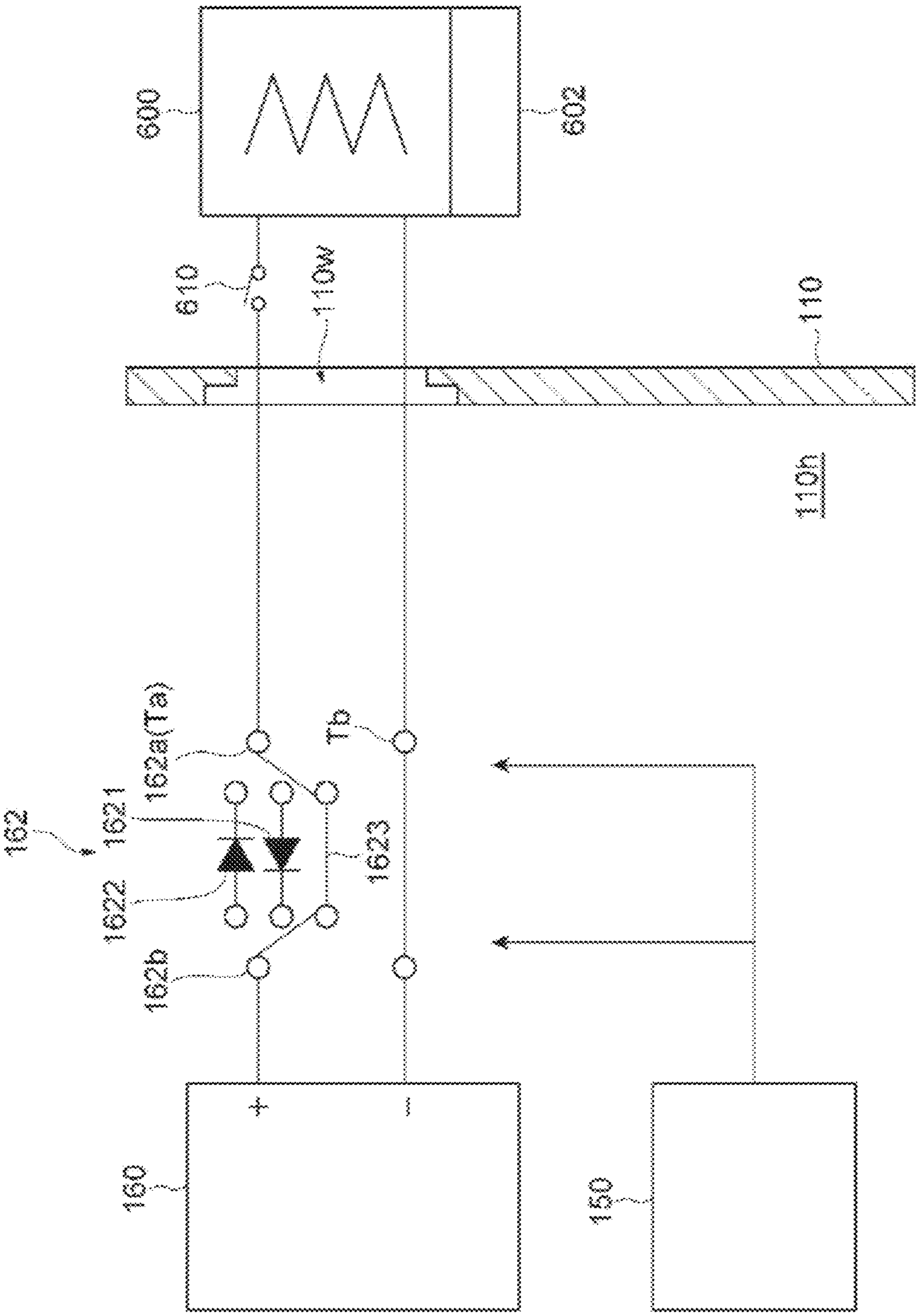

FIG. 35 is a diagram illustrating a state in which the electricity storage unit in the plasma processing system according to one exemplary embodiment is discharged.

Figure 36:
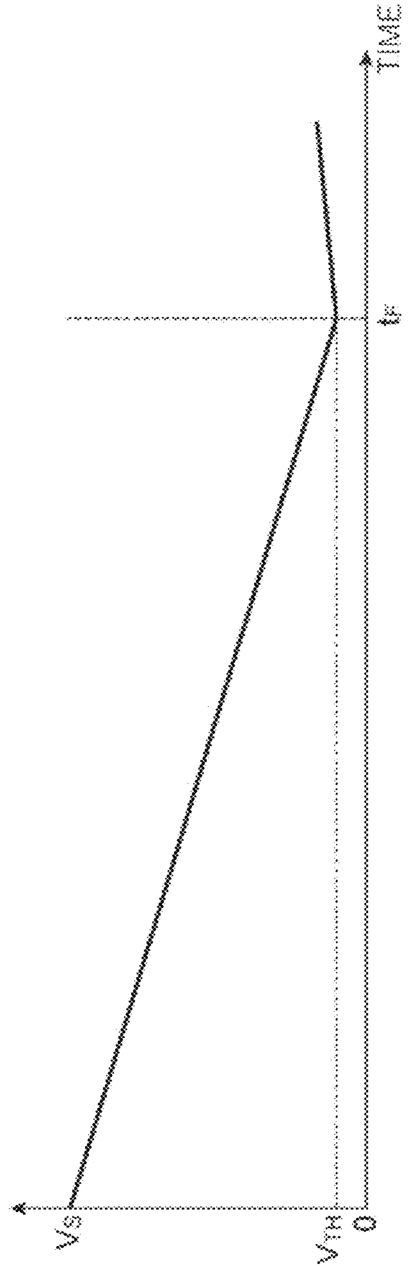

FIG. 36 is a timing chart related to the discharging of the electricity storage unit in the plasma processing system according to one exemplary embodiment.

Figure 37:
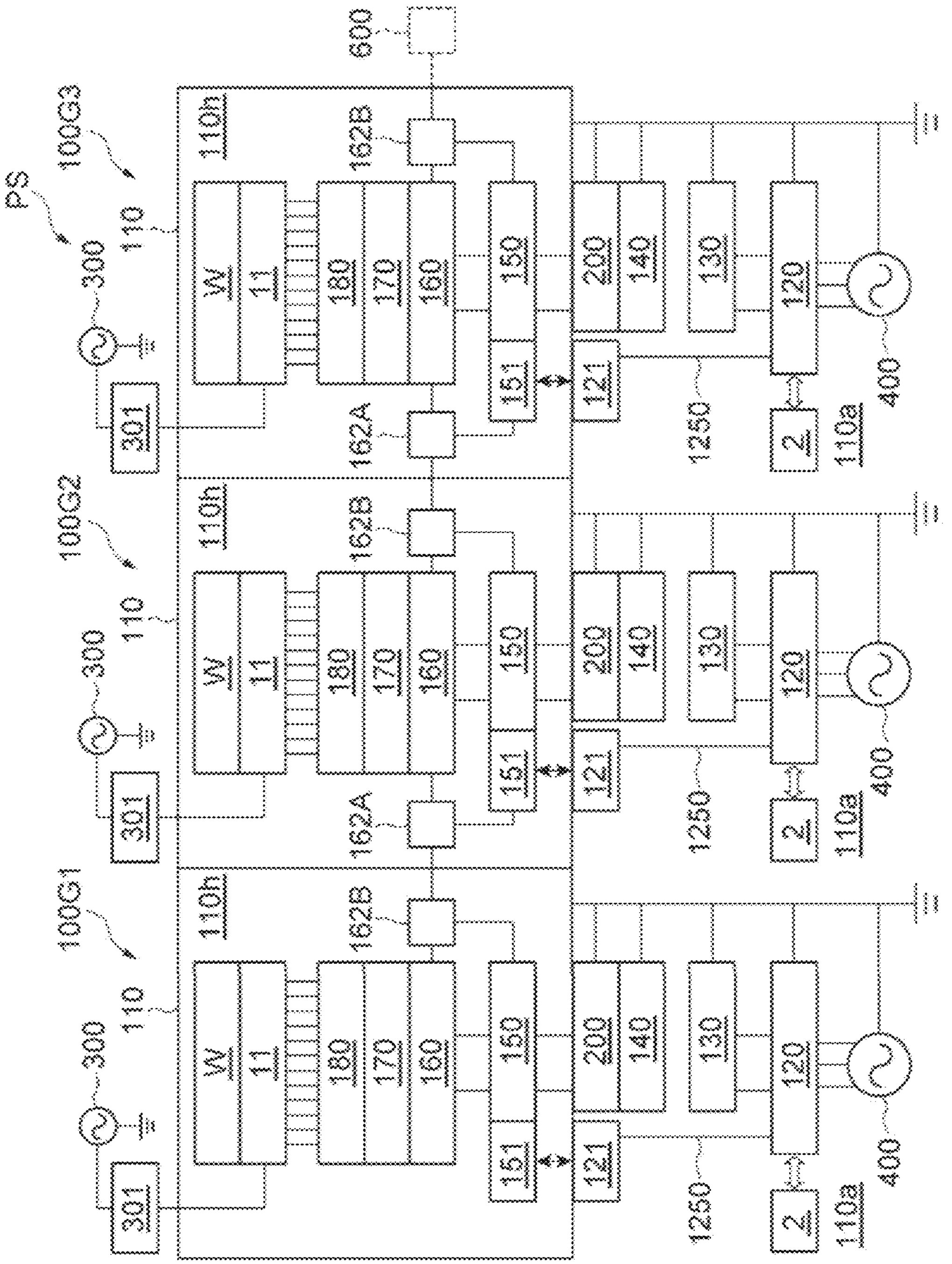

FIG. 37 is a diagram illustrating a plasma processing system according to another exemplary embodiment.

DETAILED DESCRIPTION

Hereinafter, various exemplary embodiments will be described in detail with reference to the drawings, in which the same or corresponding portions are designated by the same reference numerals.

Figure 1:
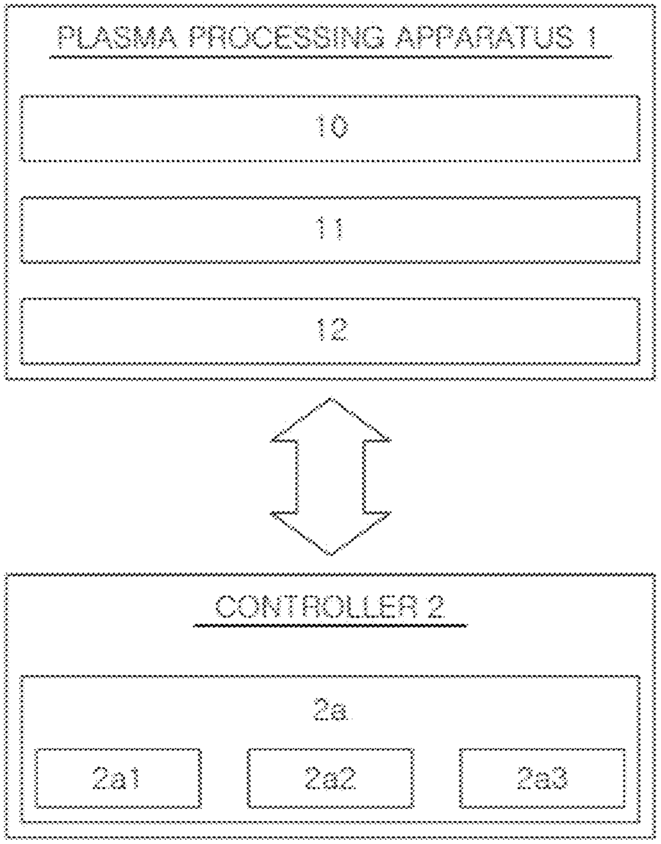
FIG. 1 is a diagram illustrating an example of a configuration of a plasma processing system.

FIG. 1 is a diagram illustrating an example of a configuration of a plasma processing system. In an embodiment, the plasma processing system includes a plasma processing apparatus 1 and a controller (control circuitry, processing circuitry) 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 has at least one gas inlet for supplying at least one processing gas to the plasma processing space and at least one gas outlet for discharging the gas from the plasma processing space. The gas inlet is connected to a gas supply portion 20 to be described later, and the gas outlet is connected to an exhaust system 40 to be described later. The substrate support 11 is disposed within the plasma processing space and has a substrate support surface for supporting a substrate.

The plasma generator 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance (ECR) plasma, a helicon wave excited plasma (HWP), or a surface wave plasma (SWP). Further, various types of plasma generators including an alternating current (AC) plasma generator and a direct current (DC) plasma generator may be used. In an embodiment, an AC signal (AC power) used in the AC plasma generator has a frequency in a range of 100 KHz to 10 GHz. Thus, the AC signal includes a radio frequency (RF) signal and a microwave signal. In an embodiment, the RF signal has a frequency in a range of 100 KHz to 150 MHz.

The controller 2 processes a computer executable instruction that causes the plasma processing apparatus 1 to execute various processes described in an embodiment of the present disclosure. The controller 2 may be configured to control each element of the plasma processing apparatus 1 so as to execute various processes described herein. In an embodiment, a part or all of the controller 2 may be included in the plasma processing apparatus 1. The controller 2 may include a processor 2_a_1, a memory unit 2_a_2, and a communication interface 2_a_3. The controller 2 is realized by, for example, a computer 2_a_. The processor 2_a_1 may be configured to perform various control operations by reading out a program from the memory unit 2_a_2 and executing the read out program. This program may be stored in advance in the memory unit 2_a_2, or may be acquired via a medium when necessary. The acquired program is stored in the memory unit 2_a_2, and is read out from the memory unit 2_a_2 and executed by the processor 2_a_1. The medium may be any of various memory media readable by the computer 2_a_, or may be a communication line connected to the communication interface 2_a_3. The processor 2_a_1 may be a central processing unit (CPU). The memory unit 2_a_2 may include a random access memory (RAM), a read only memory (ROM), a hard disk drive (HDD), a solid state drive (SSD), or a combination thereof. The communication interface 2_a_3 may communicate with the plasma processing apparatus 1 via a communication line such as a local area network (LAN).

Figure 2:
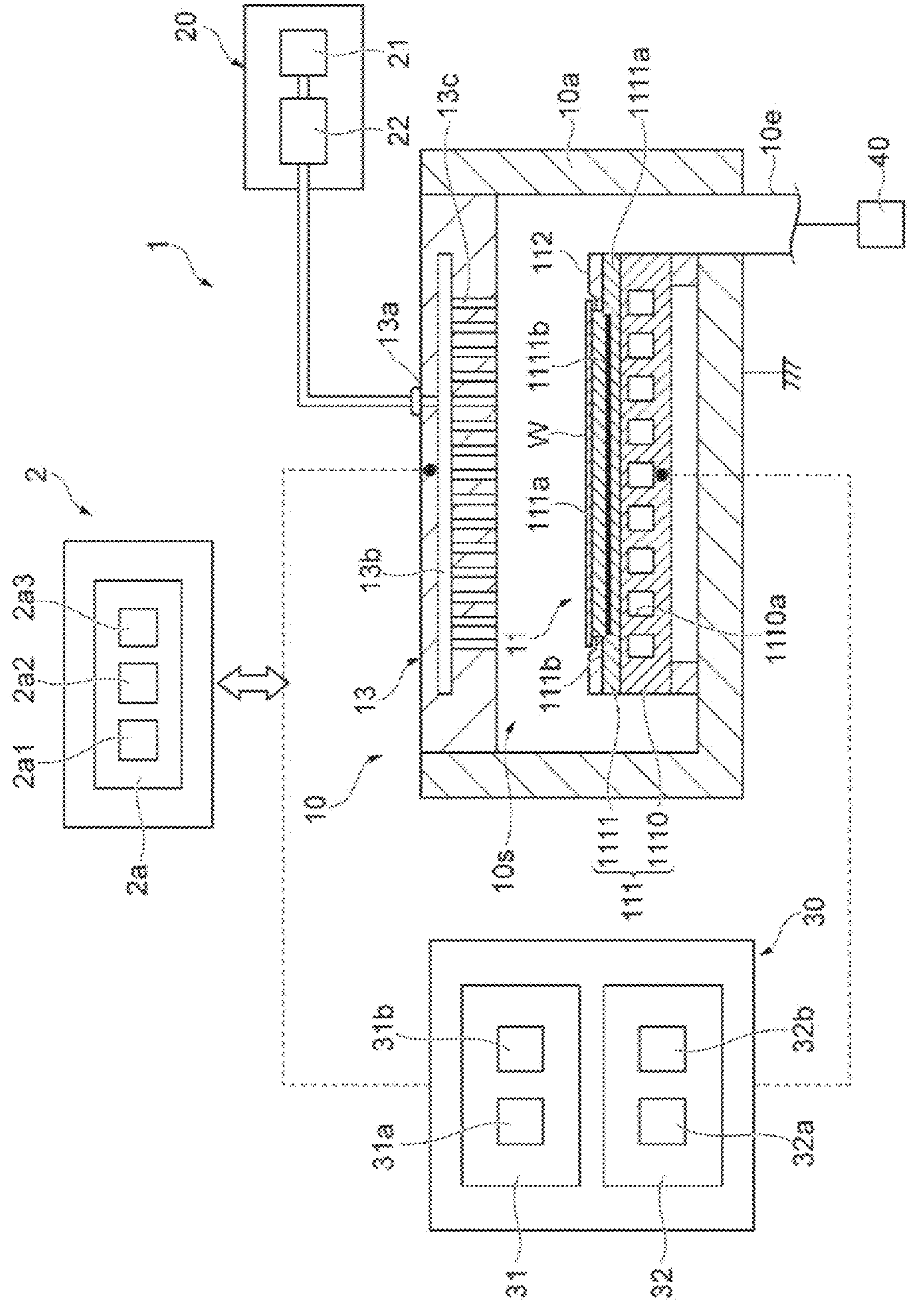
FIG. 2 is a diagram illustrating an example of a configuration of a capacitively coupled plasma processing apparatus.

Hereinafter, the configuration example of a capacitively coupled plasma processing apparatus as an example of the plasma processing apparatus 1 will be described. FIG. 2 is a diagram illustrating an example of a configuration of a capacitively coupled plasma processing apparatus.

The capacitively coupled plasma processing apparatus 1 includes the plasma processing chamber 10, a gas supply portion 20, a power supply 30, and an exhaust system 40. Further, the plasma processing apparatus 1 includes the substrate support 11 and a gas introduction portion. The gas introduction portion is configured to introduce at least one processing gas into the plasma processing chamber 10. The gas introduction portion includes a shower head 13. The substrate support 11 is disposed within the plasma processing chamber 10. The shower head 13 is disposed above the substrate support 11. In an embodiment, the shower head 13 forms at least portion of a ceiling of the plasma processing chamber 10. The plasma processing chamber 10 has a plasma processing space 10*s* defined by the shower head 13, a side wall 10*a* of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central area 111*a* for supporting a substrate W, and an annular area 111*b* for supporting the ring assembly 112. The wafer is an example of the substrate W. The annular area 111 *b* of the main body 111 surrounds the central area 111*a* of the main body 111 in a plan view. The substrate W is disposed on the central area 111*a* of the main body 111, and the ring assembly 112 is disposed on the annular area 111*b* of the main body 111 to surround the substrate W on the central area 111*a* of the main body 111. Accordingly, the central area 111*a* is also called a substrate support surface for supporting the substrate W, and the annular area 111 *b* is also called a ring support surface for supporting the ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a* and an electrostatic electrode (also called an adsorption electrode, a chuck electrode, or a clamp electrode) 1111*b* disposed within the ceramic member 1111*a*. The ceramic member 1111*a* has the central area 111*a*. In an embodiment, the ceramic member 1111*a* also has the annular area 111*b*. Further, other members surrounding the electrostatic chuck 1111, such as an annular electrostatic chuck or an annular insulating member, may be provided in the annular area 111*b*. In this connection, the ring assembly 112 may be disposed on the annular electrostatic chuck or the annular insulating member, and may be disposed on both the electrostatic chuck 1111 and the annular insulating member. Further, at least one RF/DC electrode coupled to an RF power supply 31 and/or a DC power supply 32, which will be described later, may be disposed within the ceramic member 1111*a*. In this connection, at least one RF/DC electrode functions as a lower electrode. When a bias RF signal and/or a DC signal, which will be described later, is supplied to at least one RF/DC electrode, the RF/DC electrode is also referred to as a bias electrode. Further, the conductive member of the base 1110 and at least one RF/DC electrode may function as a plurality of lower electrodes. Further, the electrostatic electrode 1111*b* may function as a lower electrode. Accordingly, the substrate support 11 includes at least one lower electrode.

The ring assembly 112 includes one or more annular members. In an embodiment, the one or more annular members include one or more edge rings and at least one cover ring. The edge ring is formed of a conductive or insulating material, and the cover ring is formed of an insulating material.

Further, the substrate support 11 may include a temperature control module configured to adjust at least one of the electrostatic chuck 1111, the ring assembly 112, and the substrate W to a target temperature. The temperature control module may include a heater, a heat transfer medium, a flow path 1110*a*, or a combination thereof. A heat transfer fluid such as brine or gas flows through the flow path 1110*a*. In an embodiment, the flow path 1110*a* is formed in the base 1110, and one or more heaters are disposed within the ceramic member 1111*a* of the electrostatic chuck 1111. Further, the substrate support 11 may include a heat transfer gas supply portion configured to supply heat transfer gas to a gap between the back surface of the substrate W and the central area 111*a*.

The shower head 13 is configured to introduce at least one processing gas from the gas supply portion 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and then is introduced from the plurality of gas introduction ports 13*c* into the plasma processing space 10*s*. Further, the shower head 13 includes at least one upper electrode. In addition to the shower head 13, the gas introduction portion may include one or more side gas injectors (SGI) installed in one or more openings formed in the side wall 10*a*.

The gas supply portion 20 may include at least one gas source 21 and at least one flow controller 22. In an embodiment, the gas supply portion 20 is configured to supply at least one processing gas from a corresponding gas source 21 through a corresponding flow controller 22 to the shower head 13. The flow controller 22 may include, for example, a mass flow controller or a pressure-controlled flow controller. Further, the gas supply portion 20 may include at least one flow modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. Thereby, plasma is formed from at least one processing gas supplied to the plasma processing space 10*s*. Accordingly, the RF power supply 31 may function as at least a portion of the plasma generator 12. Further, by supplying a bias RF signal to at least one lower electrode, a bias potential may be generated on the substrate W, and ion components in the formed plasma may be attracted into the substrate W.

In an embodiment, the RF power supply 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. In an embodiment, the source RF signal has a frequency within the range of 10 MHz to 150 MHz. In an embodiment, the first RF generator 31*a* may be configured to generate a plurality of source RF signals having different frequencies. One or more generated source RF signals are supplied to at least one lower electrode and/or at least one upper electrode.

The second RF generator 31*b* is coupled to at least one lower electrode via at least one impedance matching circuit, and is configured to generate a bias RF signal (bias RF power). The frequency of the bias RF signal may be equal to or different from the frequency of the source RF signal. In an embodiment, the bias RF signal has a frequency that is lower than the frequency of the source RF signal. In an embodiment, the bias RF signal has a frequency within the range of 100 KHz to 60 MHz. In an embodiment, the second RF generator 31*b* may be configured to generate a plurality of bias RF signals having different frequencies. One or more generated bias RF signals are supplied to at least one lower electrode. Further, in various embodiments, at least one of the source RF signal and the bias RF signal may be pulsed.

The power supply 30 may also include the DC power supply 32 coupled to the plasma processing chamber 10. The DC power supply 32 includes a first DC generator 32*a* and a second DC generator 32*b*. In one embodiment, the first DC generator 32*a* is connected to at least one lower electrode and generates a first DC signal. The generated first DC signal is applied to at least one lower electrode. In one embodiment, the second DC generator 32*b* is connected to at least one upper electrode and generates a second DC signal. The generated second DC signal is applied to at least one upper electrode.

In various embodiments, the first DC signal or the second DC signal may be pulsed. In this connection, a sequence of voltage pulses is applied to at least one lower electrode and/or to at least one upper electrode. The voltage pulse may have a rectangular, trapezoidal, or triangular pulse waveform, or a combination of these pulse waveforms. In one embodiment, a waveform generator for generating a sequence of voltage pulses based on DC signals is connected between the first DC generator 32*a* and at least one lower electrode. Thus, the first DC generator 32*a* and the waveform generator are included in a voltage pulse generator. When the second DC generator 32*b* and the waveform generator are included in the voltage generator, the voltage pulse generator is connected to at least one upper electrode. The voltage pulses may have positive or negative polarity. The sequence of voltage pulses may also include one or more positive voltage pulses and one or more negative voltage pulses within one cycle. Further, the first DC generator 32*a* and the second DC generator 32*b* may be provided in addition to the RF power supply 31, or the first DC generator 32 *a* may replace the second RF generator 31*b*.

The exhaust system 40 may be, for example, connected to a gas outlet 10*e* in the bottom of the plasma processing chamber 10. The exhaust system 40 may include a pressure control valve and a vacuum pump. The pressure control valve regulates the pressure in the plasma processing space 10*s*. The vacuum pump may include a turbomolecular pump, a dry pump, or a combination of these.

Further, in the capacitively coupled plasma processing apparatus 1, the upper electrode is disposed so that the plasma processing space is located between the upper electrode and the substrate support 11. A high frequency power supply, such as the first RF generator 31*a*, is electrically connected to the upper electrode or the lower electrode within the substrate support 11. When the plasma processing apparatus 1 is an inductively coupled plasma processing apparatus, the antenna is disposed so that the plasma processing space is located between the antenna and the substrate support 11. The high frequency power supply, such as the first RF generator 31*a*, is electrically connected to the antenna. When the plasma processing apparatus 1 is a plasma processing apparatus that generates plasma by surface waves such as microwaves, the antenna is disposed so that the plasma processing space is located between the antenna and the substrate support 11. A high frequency power supply, such as the first RF generator 31*a*, is electrically connected to the antenna via a waveguide.

Hereinafter, plasma processing apparatuses according to various exemplary embodiments will be described. Each of the plasma processing apparatuses described below is configured to supply power to at least one power consuming member in the chamber 10 by wireless power feeding (electromagnetic inductive coupling) and may have the same configuration as the plasma processing apparatus 1.

Figure 3:
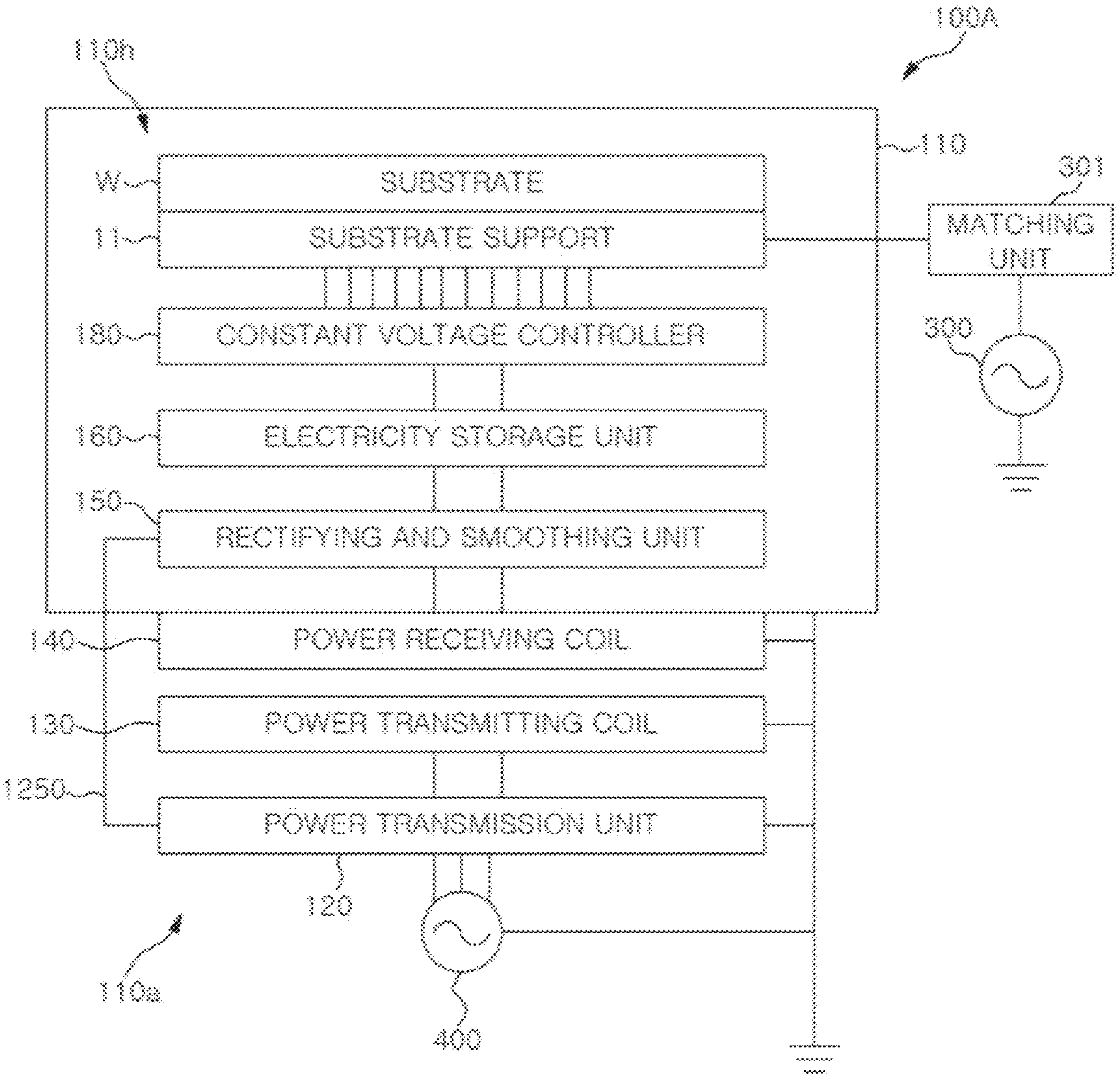
FIG. 3 is a diagram schematically illustrating a plasma processing apparatus according to one exemplary embodiment.

FIG. 3 is a diagram schematically illustrating a plasma processing apparatus according to one exemplary embodiment. The plasma processing apparatus 100A shown in FIG. 3 includes at least one high frequency power supply 300, a power receiving coil unit 140, an electricity storage unit 160, and at least one power consuming member 240 (see FIGS. 25 and 26). The plasma processing apparatus 100A may further include a power transmission unit 120, a power transmitting coil unit 130, a rectifying and smoothing unit 150, a constant voltage controller 180 (an example of a voltage controller), a ground frame 110, and a matching unit 301.

The at least one high frequency power supply 300 includes the first RF generator 31*a* and/or the second RF generator 32*a*. The at least one high frequency power supply 300 is electrically connected to the substrate support 11 via the matching unit 301. The matching unit 301 includes at least one impedance matching circuit.

The ground frame 110 includes the chamber 10 and is electrically grounded. The ground frame 110 electrically separates an internal space 110*h* (RF-Hot space) from an external space 110*a* (atmospheric space). The ground frame 110 surrounds the substrate support 11 disposed within the space 110*h*. In the plasma processing apparatus 100A, the rectifying and smoothing unit 150, the electricity storage unit 160, and the constant voltage controller 180 are disposed within the space 110*h*. In the plasma processing apparatus 100A, the power transmission unit 120, the power transmitting coil unit 130, and the power receiving coil unit 140 are disposed within the space 110*a*. The space 110*h* includes a reduced pressure space (vacuum space) and a non-reduced pressure space (non-vacuum space). The reduced pressure space is a space inside the chamber 10, while the non-reduced pressure space is a space outside the chamber 10. The substrate support 11 and the substrate W are disposed within the reduced pressure space. The rectifying and smoothing unit 150, the electricity storage unit 160, and the constant voltage controller 180 are disposed within the non-reduced pressure space.

The devices disposed within the space 110*a*, that is, the power transmission unit 120, the power transmitting coil unit 130, and the power receiving coil unit 140, are covered by a metal housing made of a metal such as aluminum, and the metal housing is grounded. This suppresses leakage of high frequency noise caused by high frequency power such as a first RF signal (source RF signal) and/or a second RF signal (bias RF signal). The metal housing and each power feeding line have an insulating distance therebetween. In the following description, high frequency power such as the first RF signal and/or the second RF signal propagating toward the power transmission unit 120 may be referred to as high frequency noise, common-mode noise, or conductive noise.

The power transmission unit 120 is electrically connected between an AC power supply 400 (for example, a commercial AC power supply) and the power transmitting coil unit 130. The power transmission unit 120 receives the frequency of AC power from the AC power supply 400 and converts the frequency of the AC power into a transmission frequency, thereby generating AC power having the transmission frequency, that is, transmission AC power.

The power transmitting coil unit 130 includes a power transmitting coil 131 (see FIG. 9), which will be described later. The power transmitting coil 131 is electrically connected to power transmission unit 120. The power transmitting coil 131 receives the transmission AC power from the power transmission unit 120 and wirelessly transmits the transmission AC power to a power receiving coil 141.

The power receiving coil unit 140 includes a power receiving coil 141 (see FIG. 9) which will be described later. The power receiving coil 141 is electromagnetically inductively coupled to the power transmitting coil 131. Electromagnetic induction coupling includes magnetic field coupling and electric field coupling. In addition, the magnetic field coupling includes magnetic resonance. The distance between the power receiving coil 141 and the power transmitting coil 131 is set so as to suppress common mode noise (conductive noise). Further, the distance between the power receiving coil 141 and the power transmitting coil 131 is set to a distance that allows power feeding. The distance between the power receiving coil 141 and the power transmitting coil 131 is set so that the attenuation of high frequency power (that is, high frequency noise) between the power receiving coil 141 and the power transmitting coil 131 is below a threshold value and so that power from the power transmitting coil 131 is received by the power receiving coil 141. The threshold value of the attenuation is set to a value that may sufficiently prevent damage or malfunction of the power transmission unit 120. The threshold value of the attenuation is, for example, −20 dB. The transmission AC power received by the power receiving coil unit 140 is output to the rectifying and smoothing unit 150.

The rectifying and smoothing unit 150 is electrically connected between the power receiving coil unit 140 and the electricity storage unit 160. The rectifying and smoothing unit 150 generates DC power by full-wave rectification and smoothing of the AC power transmitted from the power receiving coil unit 140. The DC power generated by the rectifying and smoothing unit 150 is stored in the electricity storage unit 160. The electricity storage unit 160 is electrically connected between the rectifying and smoothing unit 150 and the constant voltage controller 180. The rectifying and smoothing unit 150 may generate DC power by half-wave rectification and smoothing of the AC power transmitted from the power receiving coil unit 140.

The rectifying and smoothing unit 150 and the power transmission unit 120 are electrically connected to each other by a signal line 1250. The rectifying and smoothing unit 150 transmits an instruction signal to the power transmission unit 120 via the signal line 1250. The instruction signal is a signal for instructing the power transmission unit 120 to supply transmission AC power or to stop supplying transmission AC power. The instruction signal may include a status signal, an abnormality detection signal, and a cooling control signal for the power transmitting coil unit 130 and the power receiving coil unit 140. The status signal is a value of the magnitude and/or phase of the voltage, current, power, etc. detected by a voltage detector 155*v* (see FIG. 14) and a current detector 155*i* (see FIG. 14) of the rectifying and smoothing unit 150. The abnormality detection signal is a signal for transmitting to the power transmission unit 120 the occurrence of a failure and/or an abnormal temperature in the rectifying and smoothing unit 150. The cooling control signal controls the cooling appliances provided in the power transmitting coil unit 130 and the power receiving coil unit 140. The cooling control signal controls the number of revolutions of a fan in the case of air cooling, for example. Further, in the case of liquid cooling, the flow rate and/or temperature of a coolant are controlled.

The constant voltage controller 180 applies a voltage to at least the power consuming member 240 using the power stored in the electricity storage unit 160. The constant voltage controller 180 may at least control the application of voltage to the power consuming member 240 and the stopping of the application.

In the plasma processing apparatus 100A, the power receiving coil 141 functions as a filter against high frequency noise caused by high frequency power such as the first RF signal and/or the second RF signal. Accordingly, the propagation of high frequency noise to the power supply outside the plasma processing apparatus is suppressed.

Figure 4:
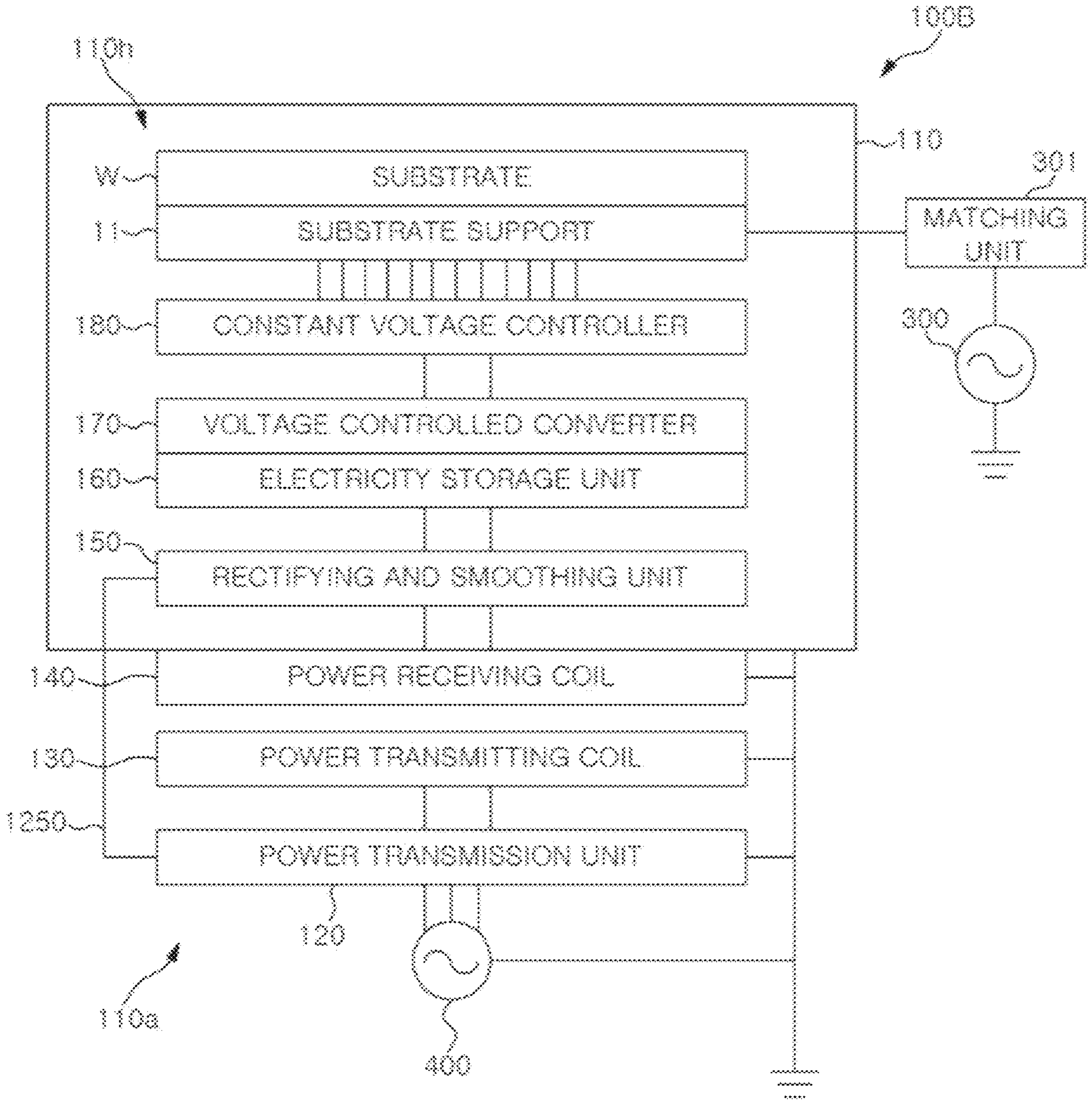
FIG. 4 is a diagram schematically illustrating a plasma processing apparatus according to another exemplary embodiment.

FIG. 4 is a diagram schematically illustrating a plasma processing apparatus according to another exemplary embodiment. Hereinafter, a plasma processing apparatus 100B shown in FIG. 4 will be described from the viewpoint of its differences from the plasma processing apparatus 100A.

The plasma processing apparatus 100B further includes a voltage controlled converter 170. The voltage controlled converter 170 is a DC-DC converter, and is connected between the electricity storage unit 160 and the constant voltage controller 180. The voltage controlled converter 170 may be configured to input a constant output voltage to the constant voltage controller 180 even when a voltage fluctuation occurs in the electricity storage unit 160. Further, the voltage fluctuation in the electricity storage unit 160 may occur as a voltage drop or the like according to the stored power when the electricity storage unit 160 is configured with an electric double layer, for example.

Figure 5:
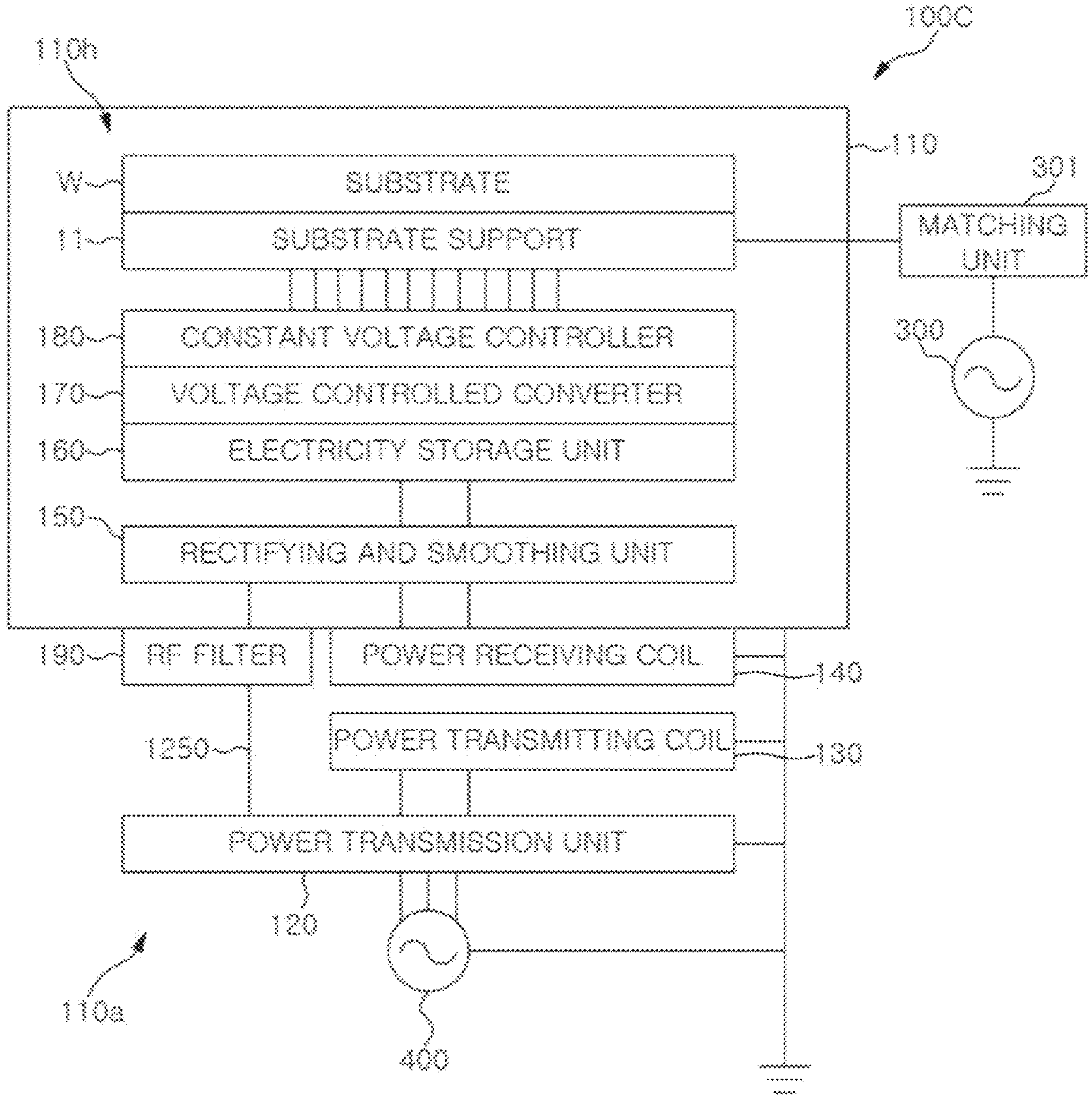
FIG. 5 is a diagram schematically illustrating a plasma processing apparatus according to yet another exemplary embodiment.

FIG. 5 is a diagram schematically illustrating a plasma processing apparatus according to yet another exemplary embodiment. Hereinafter, a plasma processing apparatus 100C shown in FIG. 5 will be described from the viewpoint of its differences from the plasma processing apparatus 100B.

The plasma processing apparatus 100C further includes an RF filter 190. The RF filter 190 is connected between the rectifying and smoothing unit 150 and the power transmission unit 120. The RF filter 190 forms a portion of the signal line 1250. The RF filter 190 has the characteristic of suppressing the propagation of high frequency power (high frequency noise) via the signal line 1250. That is, the RF filter 190 includes a low-pass filter having a characteristic of having high impedance to high frequency noise (conductive noise) but passing an instruction signal of a relatively low frequency.

In the plasma processing apparatus 100C, the electricity storage unit 160, the voltage controlled converter 170, and the constant voltage controller 180 are integrated with one another. That is, the electricity storage unit 160, the voltage controlled converter 170, and the constant voltage controller 180 are all disposed within a single metal housing or formed on a single circuit board. This shortens the length of each of a pair of power feeding lines (positive line and negative line) connecting the electricity storage unit 160 and the voltage controlled converter 170 to each other. Furthermore, the lengths of the pair of power feeding lines connecting the electricity storage unit 160 and the voltage controlled converter 170 to each other may be made equal to each other. Furthermore, the length of each of the pair of power feeding lines (positive and negative lines) connecting the voltage controlled converter 170 and the constant voltage controller 180 to each other is shortened. Furthermore, the lengths of the pair of power feeding lines connecting the voltage controlled converter 170 and the constant voltage controller 180 to each other may be made equal to each other. Accordingly, malfunction and damage of a device caused by normal mode noise (voltage difference between lines of the positive and negative lines) is suppressed. When another metal body that shields the electromagnetic field is provided around a housing within the chamber 10, a single housing does not have to be made of metal.

Figure 6:
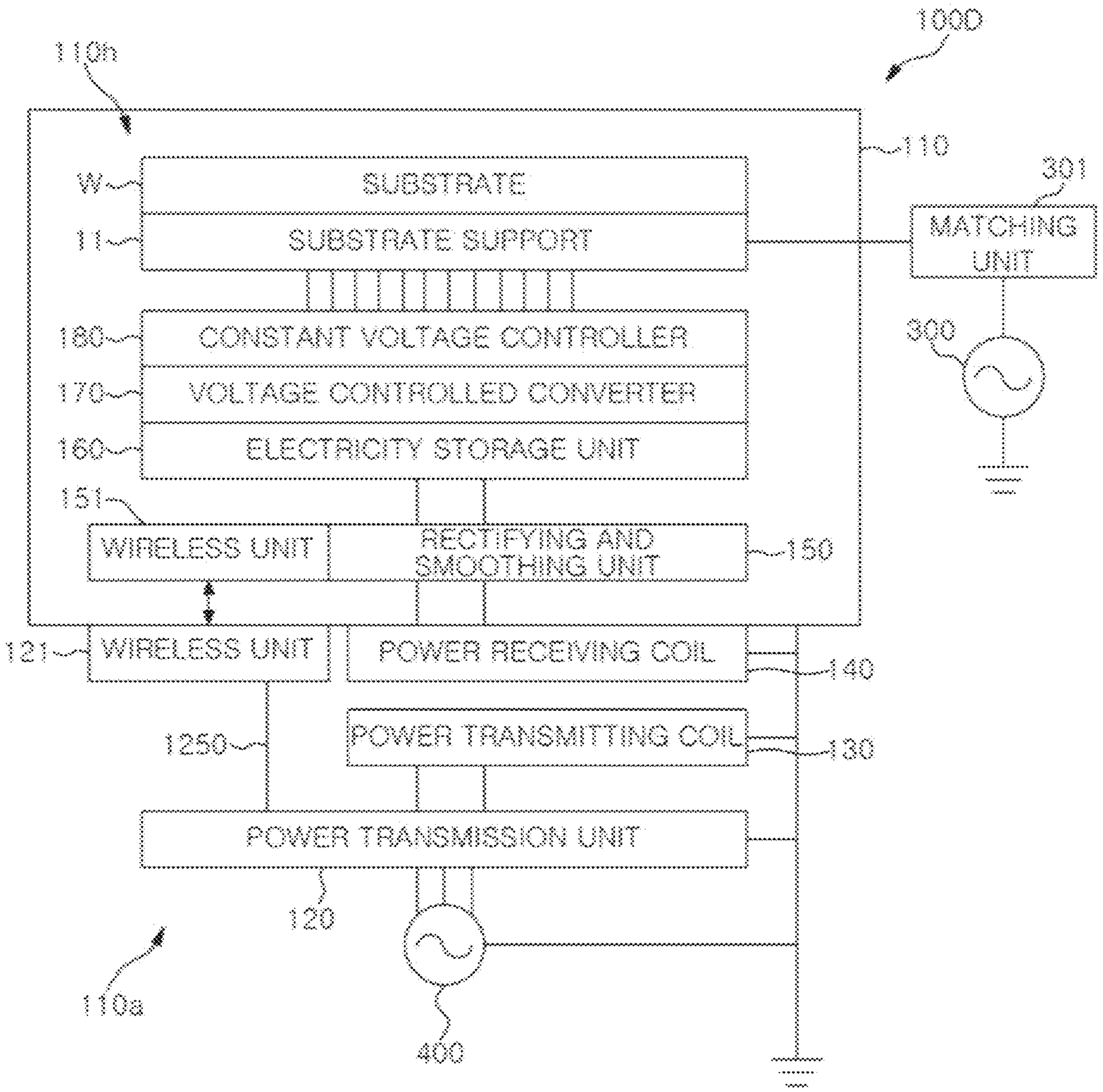
FIG. 6 is a diagram schematically illustrating a plasma processing apparatus according to yet another exemplary embodiment.

FIG. 6 is a diagram schematically illustrating a plasma processing apparatus according to yet another exemplary embodiment. Hereinafter, a plasma processing apparatus 100D shown in FIG. 6 will be described from the viewpoint of its differences from the plasma processing apparatus 100C.

The plasma processing apparatus 100D does not include the RF filter 190. In the plasma processing apparatus 100D, the rectifying and smoothing unit 150 includes a communication unit 151 which is a wireless unit. The communication unit 151 is disposed within the non-reduced pressure space. The power transmission unit 120 is connected to a communication unit 121 which is a wireless unit. The communication unit 121 is disposed within a space 110*a*. The aforementioned instruction signal is transmitted between the rectifying and smoothing unit 150 and the power transmission unit 120 using the communication unit 151 and the communication unit 121. The communication units 121 and 151 will be described in detail later.

Figure 7:
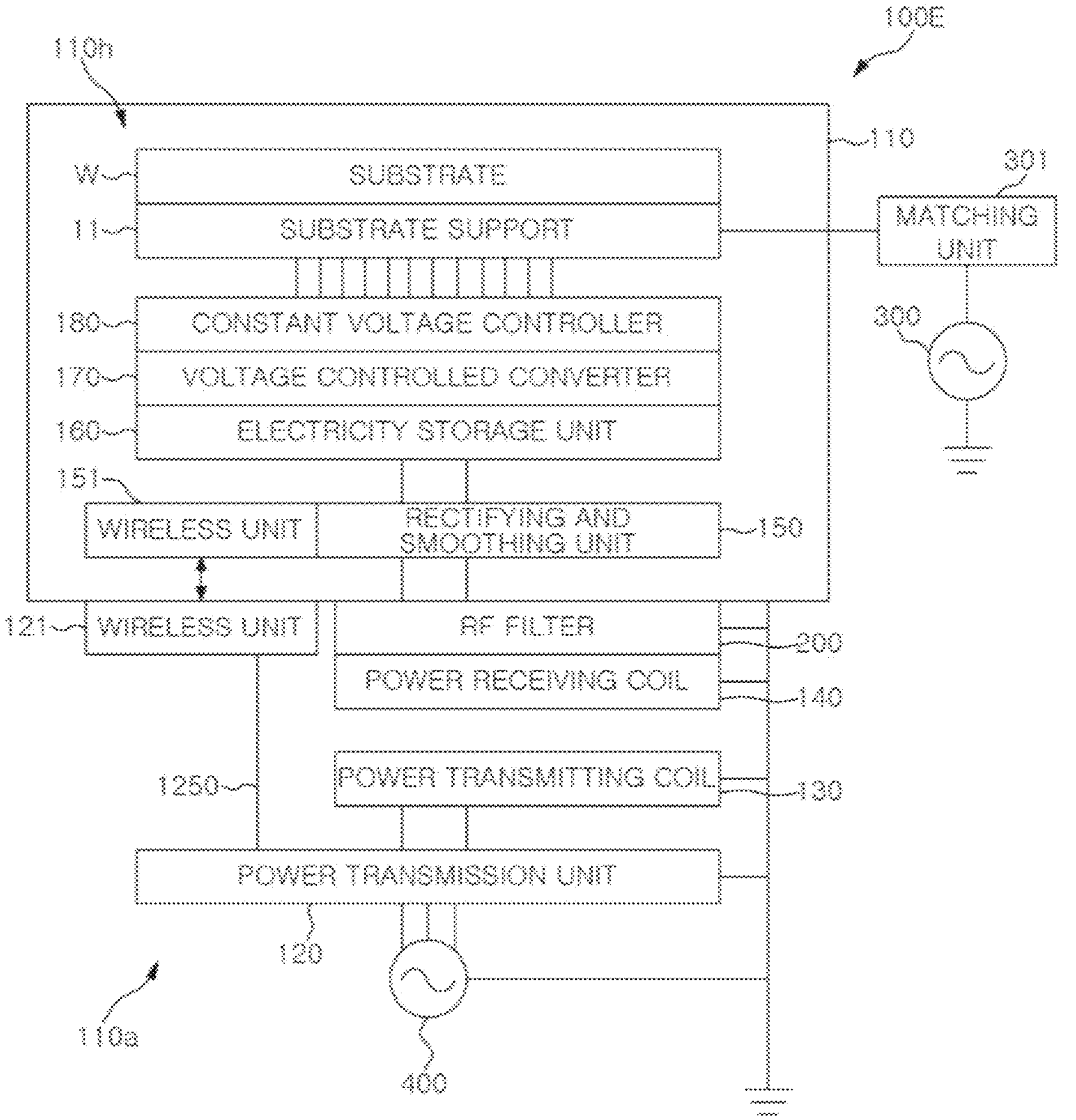
FIG. 7 is a diagram schematically illustrating a plasma processing apparatus according to yet another exemplary embodiment.

FIG. 7 is a diagram schematically illustrating a plasma processing apparatus according to yet another exemplary embodiment. Hereinafter, a plasma processing apparatus 100E shown in FIG. 7 will be described from the viewpoint of its differences from the plasma processing apparatus 100D.

The plasma processing apparatus 100E further includes an RF filter 200. The RF filter 200 is connected between the power receiving coil unit 140 and the rectifying and smoothing unit 150. The RF filter 200 has the characteristic of reducing or blocking high frequency noise propagating from the power receiving coil unit 140 to the power transmitting coil 131 and the power transmission unit 120. The RF filter 200 will be described in detail later.

Hereinafter, configurations of each portion for wireless power feeding in the plasma processing apparatuses according to various exemplary embodiments will be described in detail.

[Configuration of Power Transmission Unit]

Figure 8:
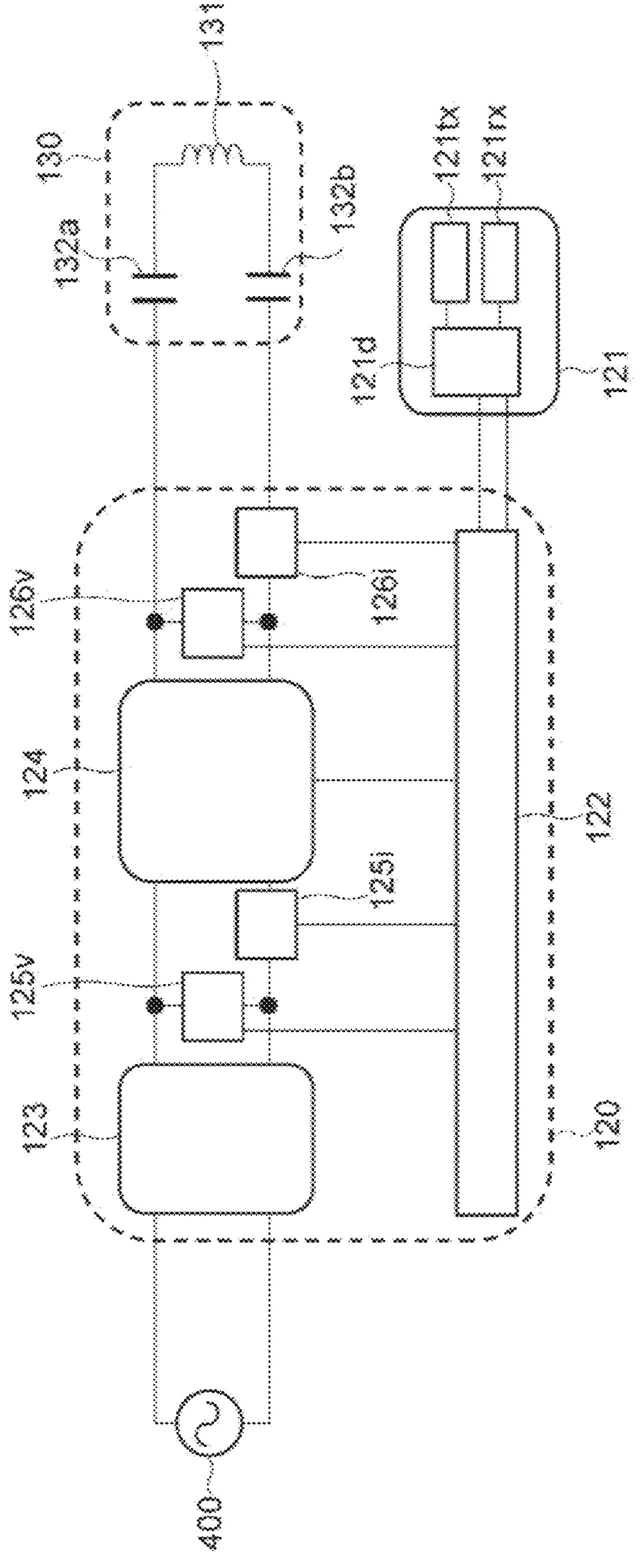
FIG. 8 is a diagram illustrating a power transmission unit according to one exemplary embodiment.

FIG. 8 is a diagram illustrating a power transmission unit according to one exemplary embodiment. As described above, the power transmission unit 120 receives the frequency of the AC power from the AC power supply 400 and converts the frequency of the AC power into a transmission frequency, thereby generating transmission AC power having the transmission frequency.

In one embodiment, the power transmission unit 120 includes a controller 122, a rectifying and smoothing unit 123, and an inverter 124. The controller 122 is configured as a processor such as a CPU or a programmable logic device such as a field-programmable gate array (FPGA).

The rectifying and smoothing unit 123 includes a rectifying circuit and a smoothing circuit (ripple filter). The rectifying circuit includes, for example, a diode bridge. The smoothing circuit includes, for example, an interline capacitor. The rectifying and smoothing unit 123 generates DC power by full-wave rectification and smoothing of the AC power from the AC power supply 400. Further, the rectifying and smoothing unit 123 may generate DC power by half-wave rectification and smoothing of the AC power from the AC power supply 400.

The inverter 124 generates transmission AC power having a transmission frequency from the DC power output by the rectifying and smoothing unit 123. The inverter 124 is, for example, a full-bridge inverter, and includes a plurality of triacs or a plurality of switching elements (for example, FETs). The inverter 124 generates the transmission AC power by ON/OFF control of the plurality of triacs or the plurality of switching elements by the controller 122. The transmission AC power output from the inverter 124 is output to the power transmitting coil unit 130.

The power transmission unit 120 may further include a voltage detector 125*v*, a current detector 125*i*, a voltage detector 126*v*, and a current detector 126*i*. The voltage detector 125*v* detects a voltage value between the pair of power feeding lines that connect the rectifying and smoothing unit 123 and the inverter 124 to each other. The current detector 125*i* detects a current value between the rectifying and smoothing unit 123 and the inverter 124. The voltage detector 126*v* detects a voltage value between the pair of power feeding lines that connect the inverter 124 and the power transmitting coil unit 130 to each other. The current detector 126*i* detects a current value between the inverter 124 and the power transmitting coil unit 130. The controller 122 is notified of the voltage value detected by the voltage detector 125*v*, the current value detected by the current detector 125*i*, the voltage value detected by the voltage detector 126*v*, and the current value detected by the current detector 126*i*.

The power transmission unit 120 is connected to the communication unit 121 described above. The communication unit 121 includes a driver 121*d*, a transmitter 121*tx*, and a receiver 121*rx*. The transmitter 121*tx* is a transmitter of a wireless signal or a transmitter of an optical signal. The receiver 121*rx* is a receiver of a wireless signal or a receiver of an optical signal. The communication unit 121 drives the transmitter 121*tx* using the driver 121*d* to output the signal from the controller 122 from the transmitter 121*tx* as a wireless signal or an optical signal. The signal output from the transmitter 121*tx* is received by the communication unit 151 (see FIG. 14) which will be described later. Furthermore, the communication unit 121 receives a signal such as the instruction signal described above from the communication unit 151 by the receiver 121*rx*, and inputs the received signal to the controller 122 via the driver 121*d*. The controller 122 switches between outputting and stopping the transmission AC power by controlling the inverter 124 in accordance with the instruction signal received from the communication unit 151 via the communication unit 121, the voltage value detected by the voltage detector 125*v*, the current value detected by the current detector 125*i*, the voltage value detected by the voltage detector 126*v*, and the current value detected by the current detector 126*i*.

[Power Transmitting Coil Unit and Power Receiving Coil Unit]

Figure 9:
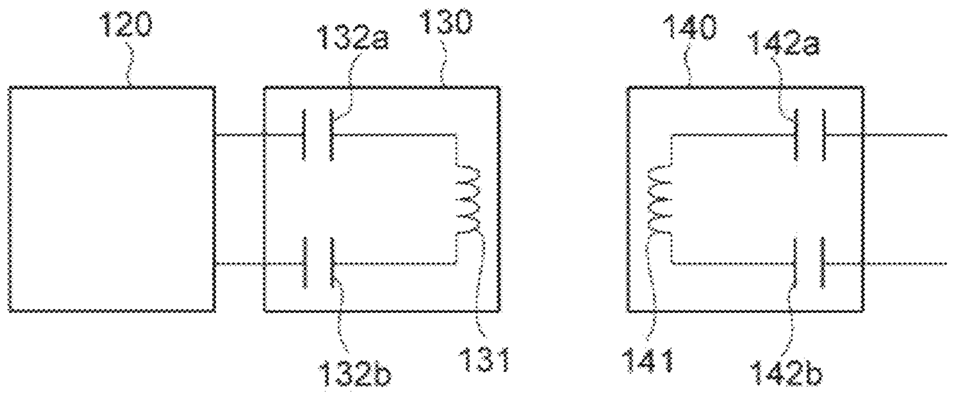
FIG. 9 is a diagram illustrating a power transmitting coil unit and a power receiving coil unit according to one exemplary embodiment.
Figure 10:
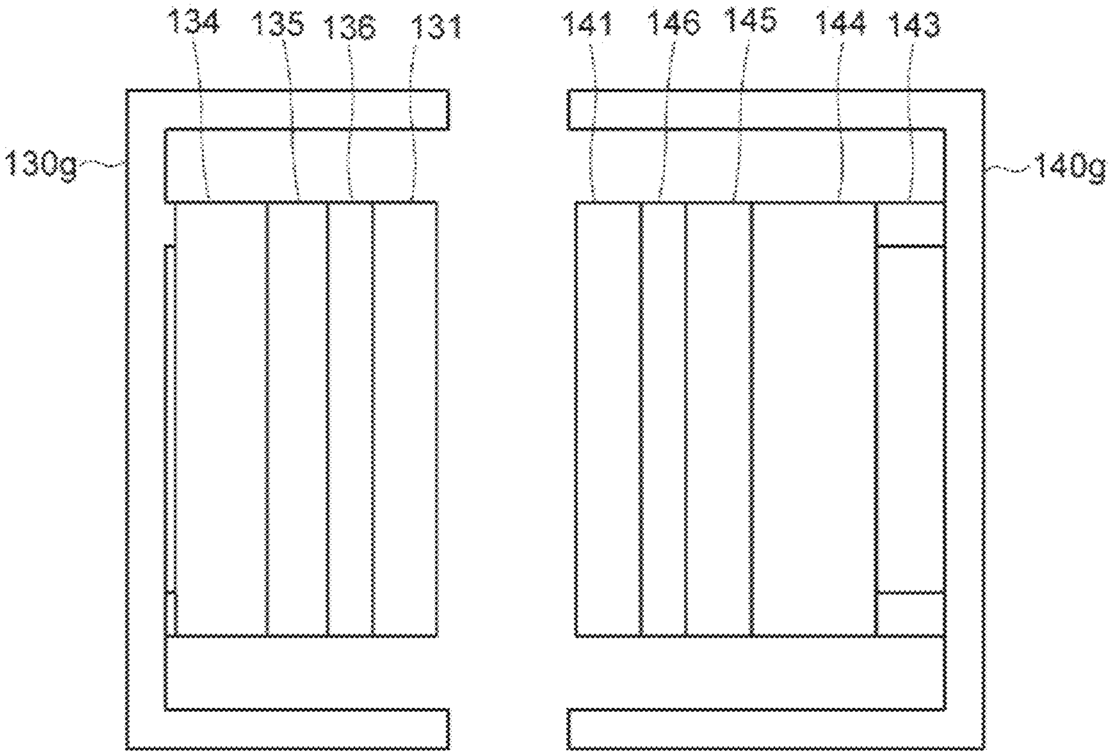
FIG. 10 is a diagram illustrating a power transmitting coil unit and a power receiving coil unit according to one exemplary embodiment.
Figure 11:
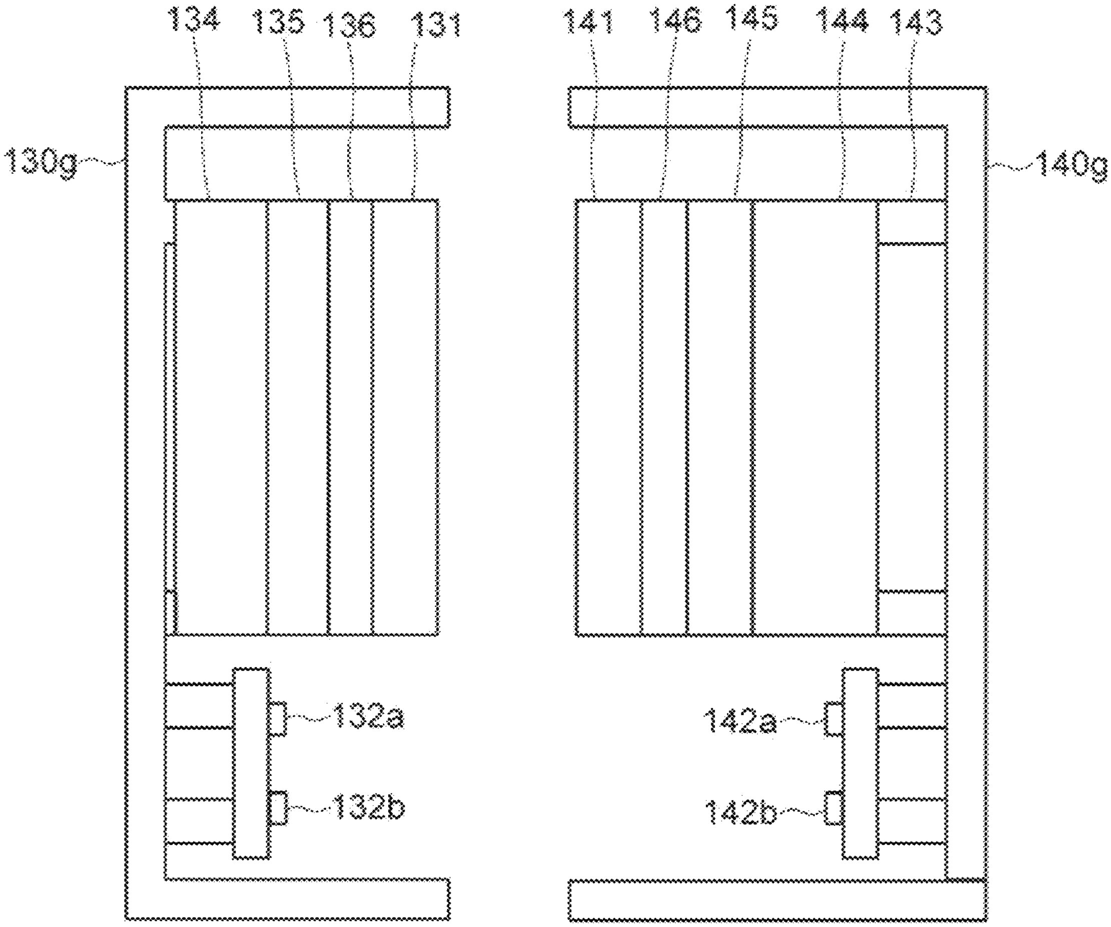
FIG. 11 is a diagram illustrating a power transmitting coil unit and a power receiving coil unit according to one exemplary embodiment.

Each of FIGS. 9 to 11 is a diagram illustrating a power transmitting coil unit and a power receiving coil unit according to one exemplary embodiment. As shown in FIG. 9, the power transmitting coil unit 130 may include, in addition to the power transmitting coil 131, a resonant capacitor 132*a* and a resonant capacitor 132*b*. The resonant capacitor 132*a* is connected between one of the pair of power feeding lines that connect the power transmission unit 120 and the power transmitting coil unit 130 to each other and one end of the power transmitting coil 131. The resonant capacitor 132*b* is connected between the other of the pair of power feeding lines and the other end of the power transmitting coil 131. The power transmitting coil 131, the resonant capacitor 132*a*, and the resonant capacitor 132*b* form a resonant circuit for the transmission frequency. That is, the power transmitting coil 131, the resonant capacitor 132*a*, and the resonant capacitor 132*b* have a resonant frequency that is approximately equal to the transmission frequency. Further, the power transmitting coil unit 130 does not necessarily have to include either the resonant capacitor 132*a* or the resonant capacitor 132*b*.

As shown in FIGS. 10 and 11, the power transmitting coil unit 130 may further include a metal housing 130*g*. The metal housing 130*g* has an open end and is grounded. The power transmitting coil 131 is disposed within the metal housing 130*g* with an insulation distance secured therebetween. The power transmitting coil unit 130 may further include a heat sink 134, a ferrite material 135, and a thermally conductive sheet 136. The heat sink 134 is disposed within the metal housing 130*g* and is supported by the metal housing 130*g*. The ferrite material 135 is disposed on the heat sink 134. The thermally conductive sheet 136 is disposed on the ferrite material 135. The power transmitting coil 131 is disposed on the thermally conductive sheet 136 and faces the power receiving coil 141 via the open end of the metal housing 130*g*. As shown in FIG. 11, the resonant capacitor 132*a* and the resonant capacitor 132*b* may be further accommodated within the metal housing 130*g*.

As shown in FIG. 9, the power receiving coil unit 140 includes the power receiving coil 141. The power receiving coil 141 is electromagnetically inductively coupled to the power transmitting coil 131. The power receiving coil unit 140 may include, in addition to the power receiving coil 141, a resonant capacitor 142*a* and a resonant capacitor 142*b*. The resonant capacitor 142*a* is connected between one of the pair of power feeding lines extending from the power receiving coil unit 140 and one end of the power receiving coil 141. The resonant capacitor 142*b* is connected between the other of the pair of power feeding lines and the other end of the power receiving coil 141. The power receiving coil 141, the resonant capacitor 142*a*, and the resonant capacitor 142*b* form a resonant circuit for the transmission frequency. That is, the power receiving coil 141, the resonant capacitor 142*a*, and the resonant capacitor 142*b* have a resonant frequency that is approximately equal to the transmission frequency. Further, the power receiving coil unit 140 does not necessarily have to include either the resonant capacitor 142*a* or the resonant capacitor 142*b*.

As shown in FIGS. 10 and 11, the power receiving coil unit 140 may further include a metal housing 140*g*. The metal housing 140*g* has an open end and is grounded. The power receiving coil 141 is disposed within the metal housing 140*g* with an insulation distance secured therebetween. The power receiving coil unit 140 may further include a spacer 143, a heat sink 144, a ferrite material 145, and a thermally conductive sheet 146. The spacer 143 is disposed within the metal housing 140*g* and is supported by the metal housing 140*g*. The spacer 143 will be described later. The heat sink 144 is disposed on the spacer 143. The ferrite material 145 is disposed on the heat sink 144. The thermally conductive sheet 146 is disposed on the ferrite material 145. The power receiving coil 141 is disposed on the thermally conductive sheet 146 and faces the power transmitting coil 131 via the open end of the metal housing 140*g*. As shown in FIG. 11, the resonant capacitor 142*a* and the resonant capacitor 142*b* may be further accommodated within the metal housing 140*g*.

The spacer 143 is made of a dielectric material and is provided between the power receiving coil 141 and the metal housing 140*g* (ground). The spacer 143 provides a space stray capacity between the power receiving coil 141 and the ground.

[Impedance Characteristics of Power Receiving Coil Unit]

Figure 12:
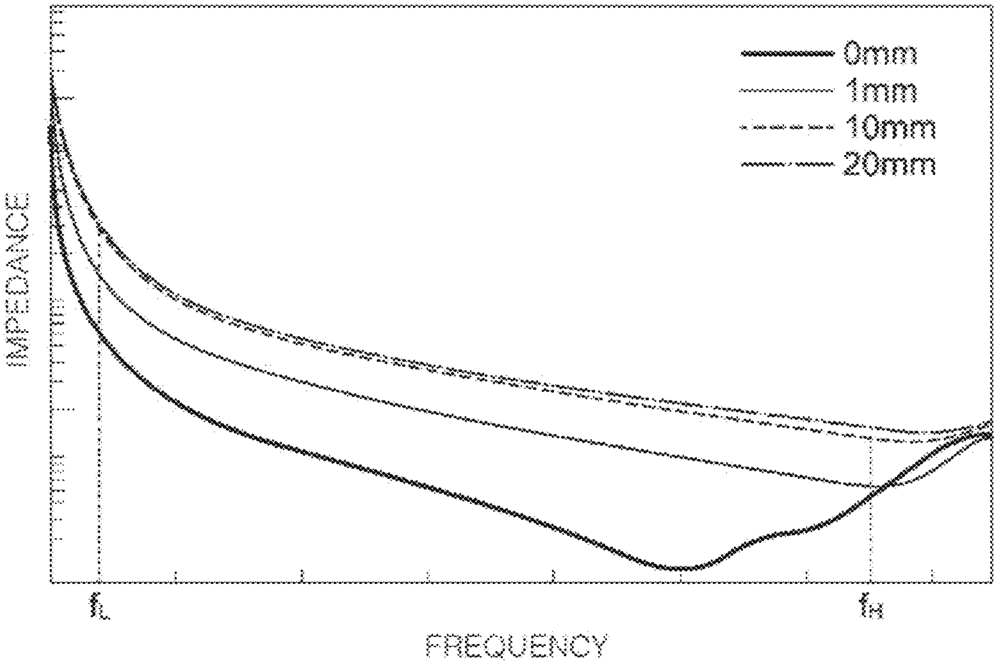
FIG. 12 is a graph showing the impedance characteristics of a power receiving coil unit according to one exemplary embodiment.

FIG. 12 is a graph showing the impedance characteristics of a power receiving coil unit according to one exemplary embodiment. FIG. 12 shows the impedance characteristics of the power receiving coil unit 140 according to the thickness of the spacer 143. The thickness of the spacer 143 corresponds to the distance between the heat sink 144 and the metal housing 140*g*. As shown in FIG. 12, the power receiving coil unit 140 may adjust the impedance of each of frequencies $f_H$ and $f_L$ in accordance with the thickness of the spacer 143. Accordingly, the power receiving coil unit 140 may provide high impedance at each of the frequencies of two high frequency powers used in the plasma processing apparatus, such as the first RF signal and the second RF signal. Furthermore, since a high impedance may be obtained in the power receiving coil unit 140, the loss of high frequency power may be suppressed and a high processing rate (for example, an etching rate) may be obtained.

[RF Filter 200]

Figure 13:
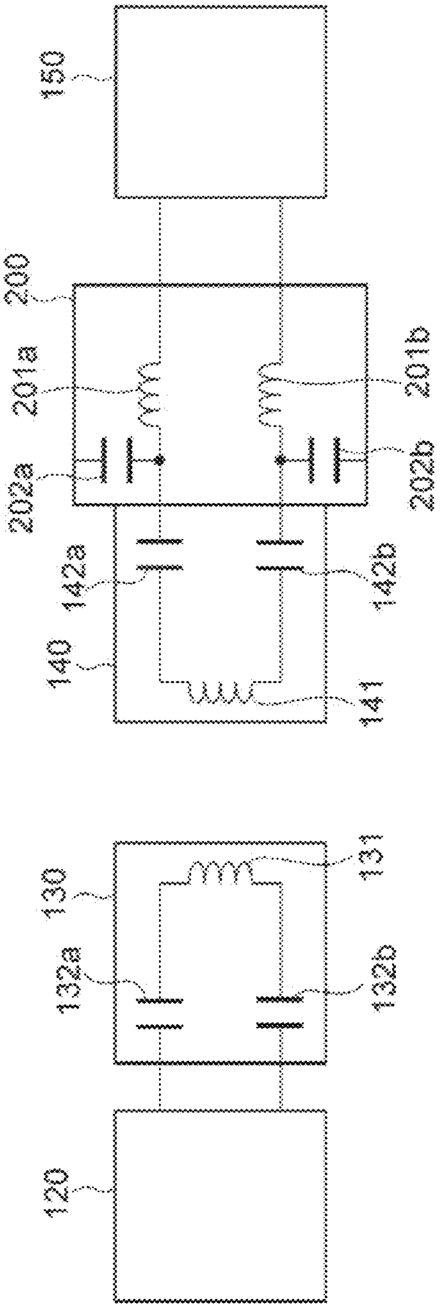
FIG. 13 is a diagram illustrating an RF filter according to one exemplary embodiment.

FIG. 13 is a diagram illustrating an RF filter according to one exemplary embodiment. As shown in FIG. 13, the RF filter 200 is connected between the power receiving coil unit 140 and the rectifying and smoothing unit 150. The RF filter 200 includes an inductor 201*a*, an inductor 201*b*, a termination capacitor 202*a*, and a termination capacitor 202*b*. One end of the inductor 201*a* is connected to the resonant capacitor 142*a*, and the other end of the inductor 201*a* is connected to the rectifying and smoothing unit 150. One end of the inductor 201*b* is connected to the resonant capacitor 142*b*, and the other end of the inductor 201*b* is connected to the rectifying and smoothing unit 150. The termination capacitor 202*a* is connected between one end of the inductor 201*a* and the ground. The termination capacitor 202*b* is connected between one end of the inductor 201*b* and the ground. The inductor 201*a* and the termination capacitor 202*a* form a low pass filter. Additionally, the inductor 201*b* and the termination capacitor 202*b* form a low pass filter. The RF filter 200 makes it possible to obtain a high impedance at each of the frequencies of the two high frequency powers used in the plasma processing apparatus, such as the first RF signal and the second RF signal. Accordingly, the loss of high frequency power may be suppressed, and a high processing rate (for example, etching rate) may be obtained.

[Rectifying and Smoothing Unit]

Figure 14:
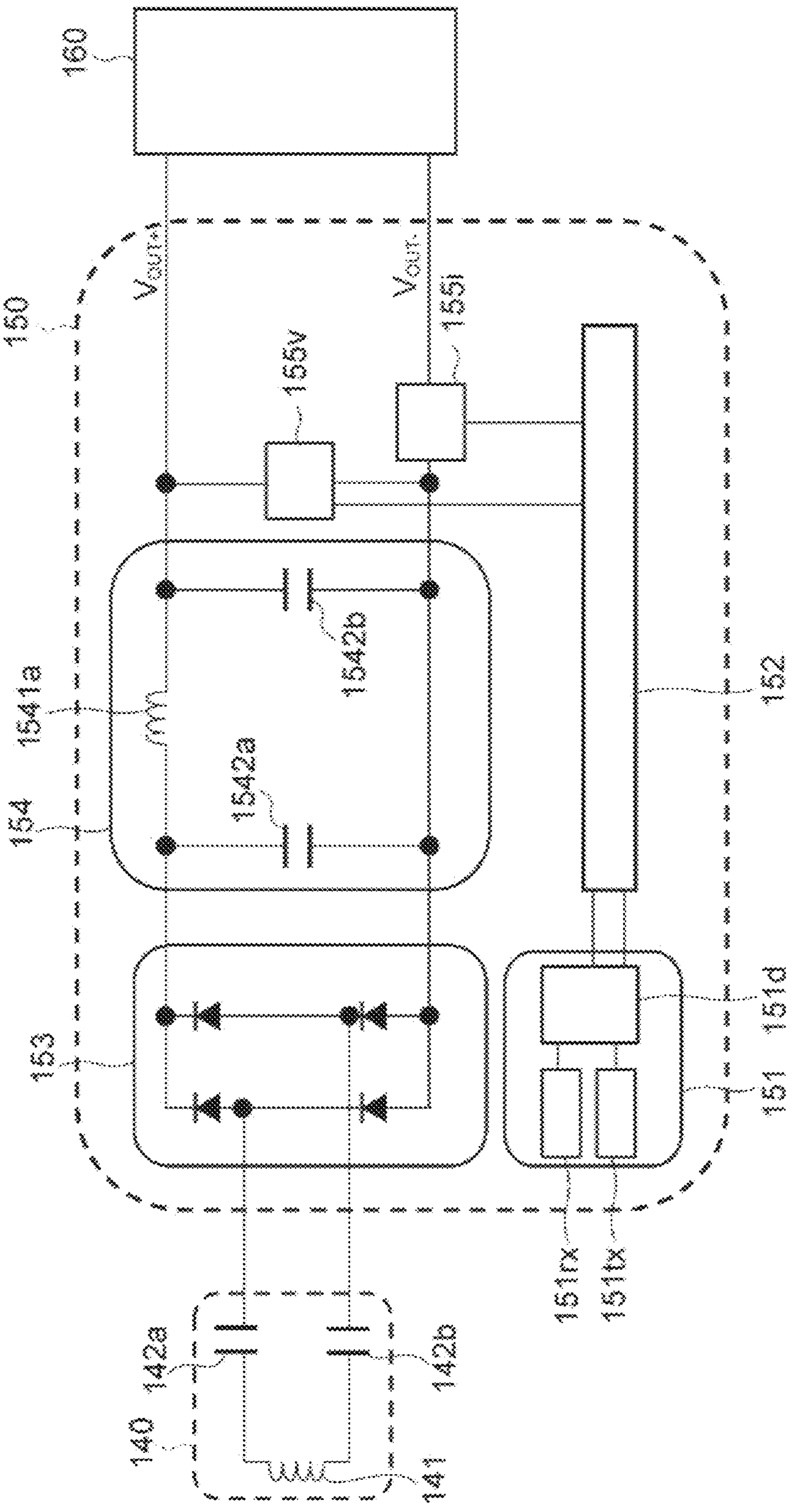
FIG. 14 is a diagram illustrating a rectifying and smoothing unit according to one exemplary embodiment.

FIG. 14 is a diagram illustrating a rectifying and smoothing unit according to one exemplary embodiment. In one embodiment, the rectifying and smoothing unit 150 includes a controller 152, a rectifying circuit 153, and a smoothing circuit 154. The rectifying circuit 153 is connected between the power receiving coil unit 140 and the smoothing circuit 154. The smoothing circuit 154 is connected between the rectifying circuit 153 and the electricity storage unit 160. The controller 152 is configured as a processor such as a CPU or a programmable logic device such as a field-programmable gate array (FPGA). Further, the controller 152 may be the same as or different from the controller 122.

The rectifying circuit 153 outputs power generated by full-wave rectification of the AC power from the power receiving coil unit 140. The rectifying circuit 153 is, for example, a diode bridge. Further, the rectifying circuit 153 may output power generated by half-wave rectification of the AC power from the power receiving coil unit 140.

The smoothing circuit 154 generates DC power by smoothing the power from the rectifying circuit 153. The smoothing circuit 154 may include an inductor 1541*a*, a capacitor 1542*a*, and a capacitor 1542*b*. One end of the inductor 1541*a* is connected to one of a pair of inputs of the smoothing circuit 154. The other end of the inductor 1541*a* is connected to a positive output ($V_{OUT+}$) of the rectifying and smoothing unit 150. The positive output of the rectifying and smoothing unit 150 is connected to one end of each of one or more capacitors of the electricity storage unit 160 via a positive line 160*p* (see FIGS. 23A and 23B) of the pair of power feeding lines described below.

One end of the capacitor 1542*a* is connected to one of the pair of inputs of the smoothing circuit 154 and one end of the inductor 1541*a*. The other end of the capacitor 1542*a* is connected to the other of a pair of outputs of the smoothing circuit 154 and a negative output ($V_{OUT-}$) of the rectifying and smoothing unit 150. The negative output of the rectifying and smoothing unit 150 is connected to the other end of each of one or more capacitors of the electricity storage unit 160 via a negative line 160*m* (see FIGS. 23A and 23B) of the pair of power feeding lines described below. One end of the capacitor 1542*b* is connected to the other end of the inductor 1541*a*. The other end of the capacitor 1542*b* is connected to the other of the pair of outputs of the smoothing circuit 154 and the negative output ($V_{OUT-}$) of the rectifying and smoothing unit 150.

The rectifying and smoothing unit 150 may further include a voltage detector 155*v* and a current detector 155*i*. The voltage detector 155*v* detects a voltage value between the positive output and the negative output of the rectifying and smoothing unit 150. The current detector 155*i* detects a current value between the rectifying and smoothing unit 150 and the electricity storage unit 160. The voltage value detected by the voltage detector 155*v* and the current value detected by the current detector 155*i* are provided to the controller 152. The controller 152 generates the instruction signal described above in accordance with the power stored in the electricity storage unit 160. For example, when the power stored in the electricity storage unit 160 is equal to or less than a first threshold value, the controller 152 generates an instruction signal to instruct the power transmission unit 120 to feed power, that is, to output transmission AC power. The first threshold value is the power consumption at a load, for example, the power consuming member 240. In addition, considering margin, the power consumption of a load such as the power consuming member 240 may be multiplied by a certain value (for example, a value within the range of 1 to 3). When the power stored in the electricity storage unit 160 is greater than a second threshold value, the controller 152 generates an instruction signal to instruct the power transmission unit 120 to stop feeding power, that is, to stop outputting the transmission AC power. The second threshold value is a value that does not exceed limit electricity storage power of the electricity storage unit 160. The second threshold value is, for example, a value obtained by multiplying the limit electricity storage power of the electricity storage unit 160 by a certain value (for example, a value equal to or less than 1).

The rectifying and smoothing unit 150 includes the communication unit 151 described above. The communication unit 151 includes a driver 151*d*, a transmitter 151*tx*, and a receiver 151*rx*. The transmitter 151*tx* is a transmitter of a wireless signal or a transmitter of an optical signal. The receiver 151*rx* is a receiver of a wireless signal or a receiver of an optical signal. The communication unit 151 drives the transmitter 151*tx* by the driver 151*d* to output a signal from the controller 122, such as an instruction signal, from the transmitter 151*tx* as a wireless signal or an optical signal. The signal output from the transmitter 151*tx* is received by the communication unit 121 of the power transmission unit 120. Furthermore, the communication unit 151 receives a signal from the communication unit 121 by the receiver 151*rx*, and outputs the received signal to the controller 152 via the driver 151*d*.

[RF Filter 190]

Figure 15:
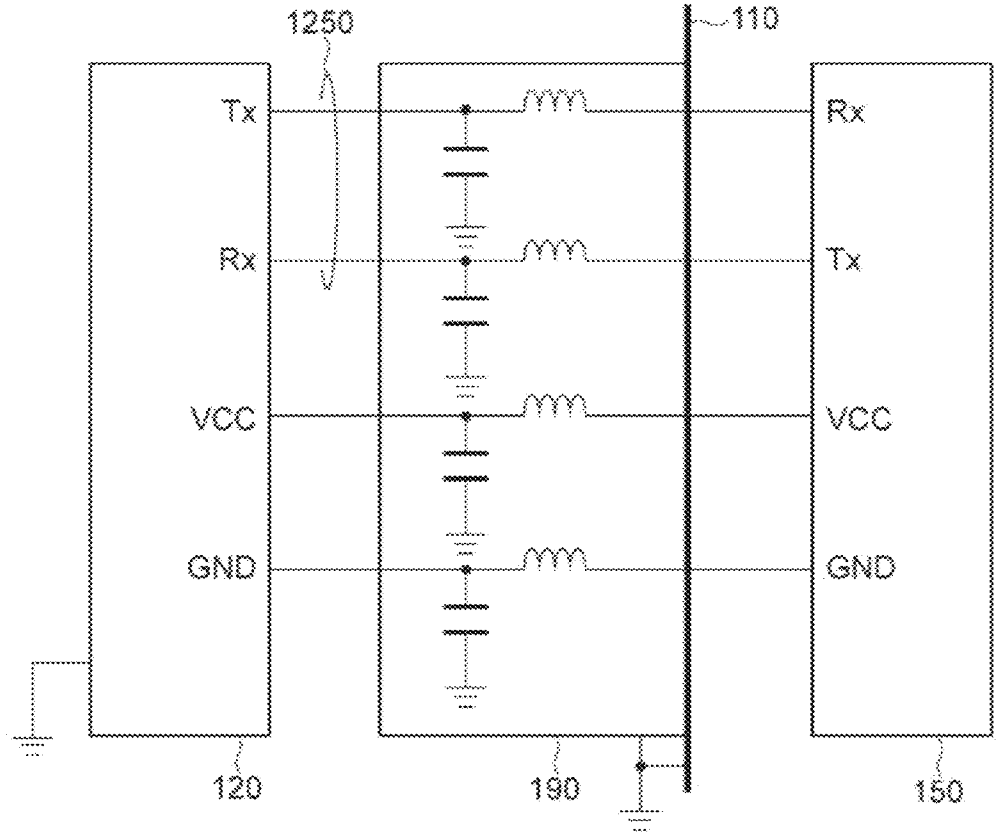
FIG. 15 is a diagram illustrating an RF filter according to one exemplary embodiment.

FIG. 15 is a diagram illustrating the RF filter 190 according to one exemplary embodiment. As shown in FIG. 15, the signal line 1250 may include a first signal line electrically connecting a signal output (Tx) of the power transmission unit 120 and a signal input (Rx) of the rectifying and smoothing unit 150, and a second signal line electrically connecting the signal input (Rx) of the power transmission unit 120 and the signal output (Tx) of the rectifying and smoothing unit 150. The signal line 1250 may include a signal line connecting a first reference voltage terminal (VCC) of the power transmission unit 120 and the first reference voltage terminal (VCC) of the rectifying and smoothing unit 150, and a signal line connecting a second reference voltage terminal (GND) of the power transmission unit 120 and the second reference voltage terminal (GND) of the rectifying and smoothing unit 150. The signal line 1250 may be a shielded cable covered with a shield at ground potential. In this connection, a plurality of signal lines constituting the signal line 1250 may be individually covered with a shield or may be collectively covered with a shield. The RF filter 190 provides a low pass filter for each of the plurality of signal lines constituting the signal line 1250. The low pass filter may be an LC filter including an inductor and a capacitor. The inductor of the low pass filter forms a portion of the corresponding signal line. The capacitor is connected between one end of the inductor connected to the power transmission unit 120 and the ground. The RF filter 190 makes it possible to suppress the propagation of high frequency power (high frequency noise) via the signal line 1250 between the rectifying and smoothing unit 150 and the power transmission unit 120.

[Communication Unit of Power Transmission Unit and Communication Unit of Rectifying and Smoothing Unit]

Figure 16:
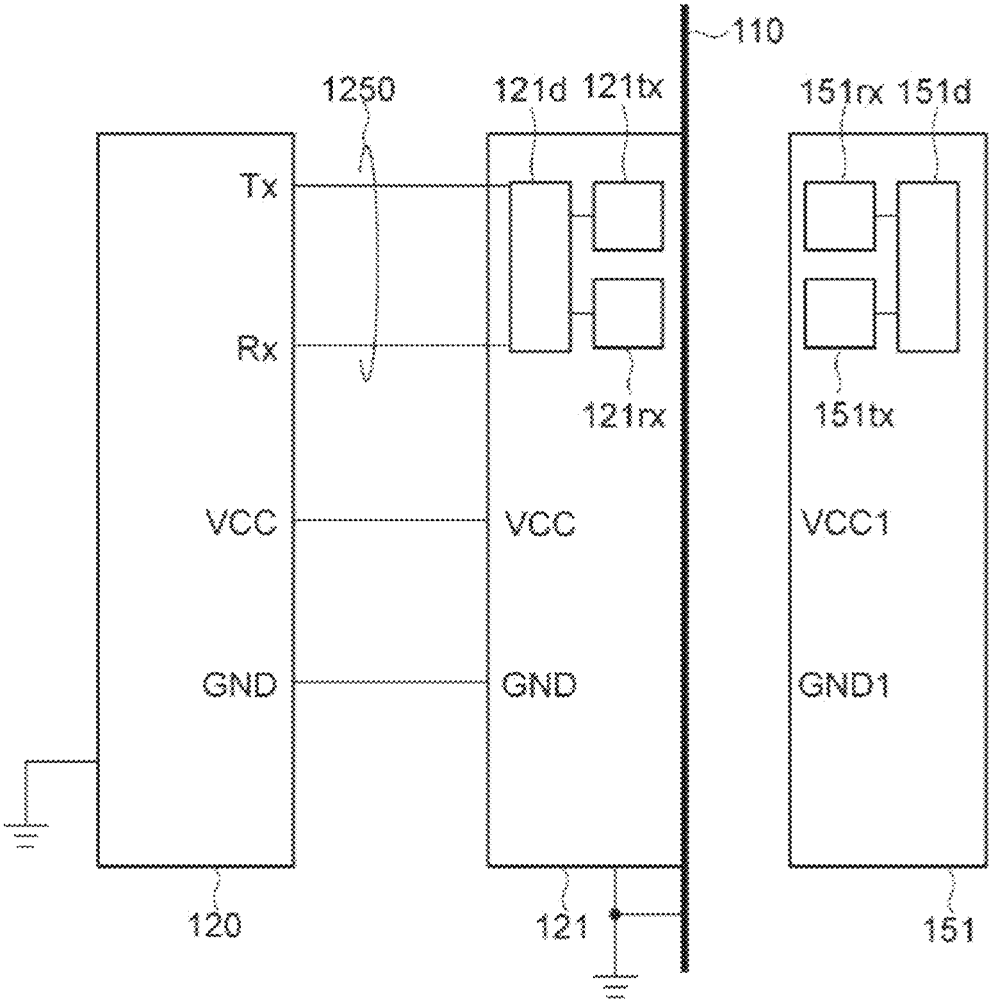
FIG. 16 is a diagram illustrating a communication unit of a power transmission unit and a communication unit of a rectifying and smoothing unit according to one exemplary embodiment.
Figure 17:
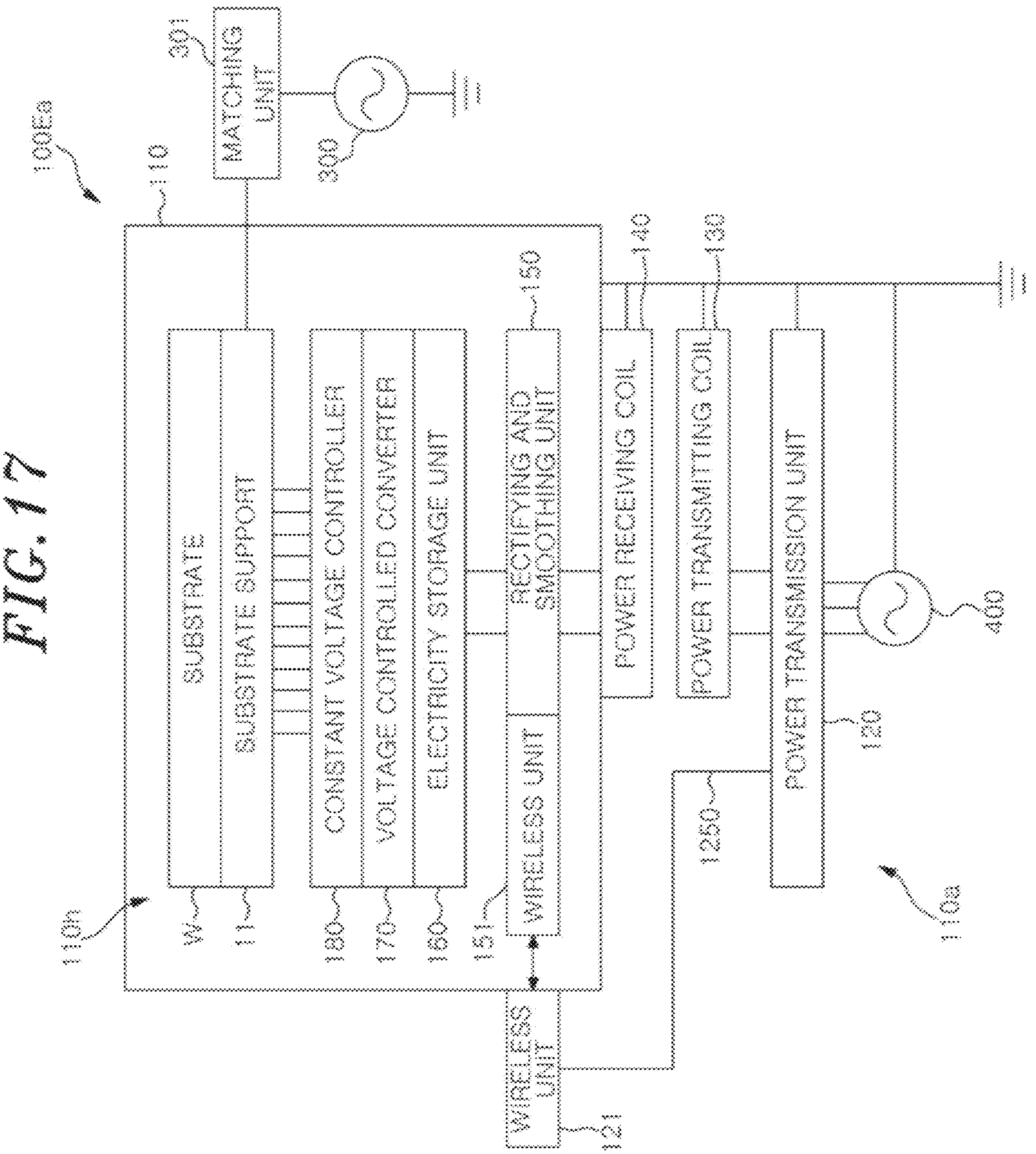
FIG. 17 is a diagram schematically illustrating a plasma processing apparatus according to yet another exemplary embodiment.
Figure 18:
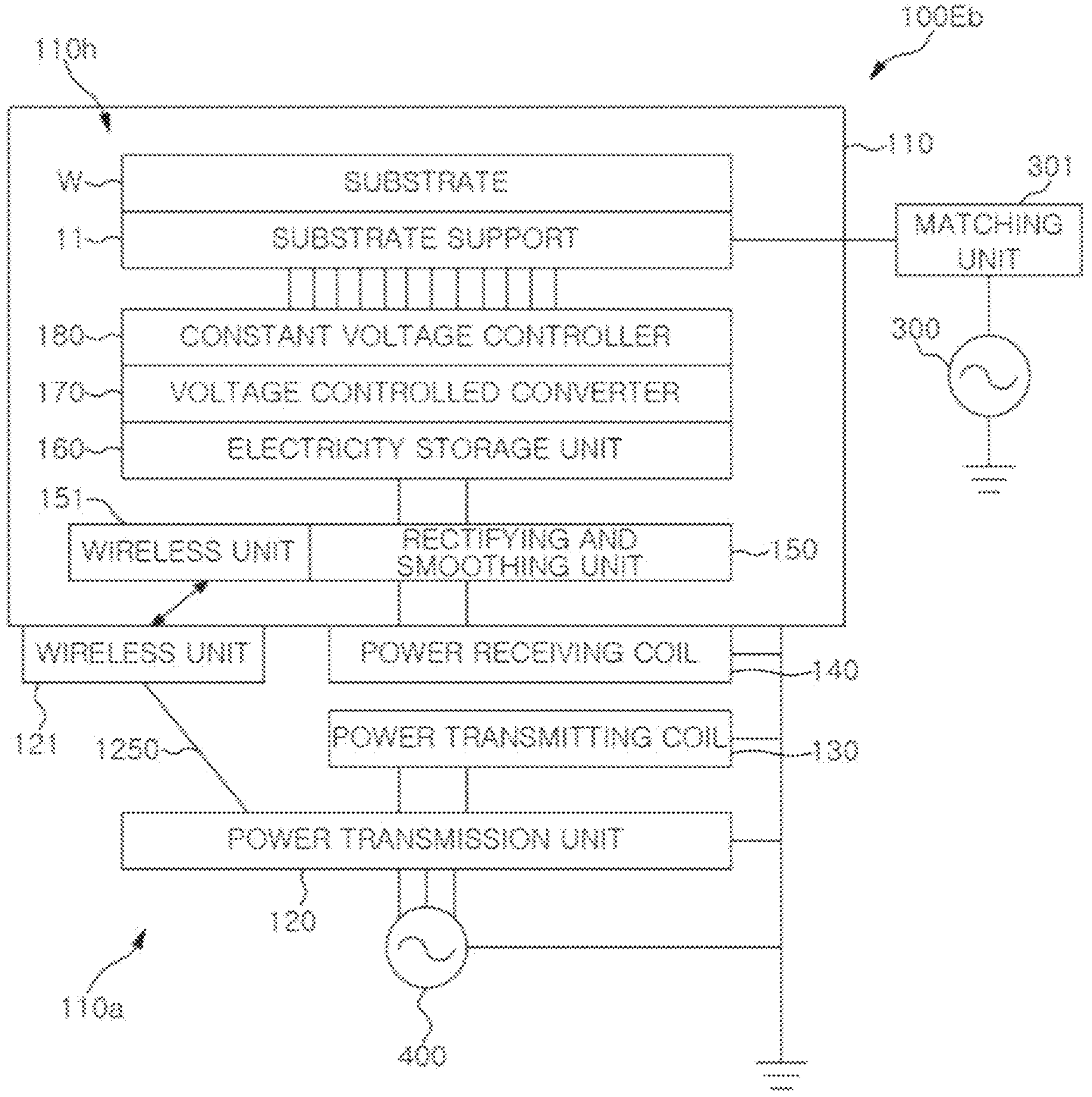
FIG. 18 is a diagram schematically illustrating a plasma processing apparatus according to yet another exemplary embodiment.

FIG. 16 is a diagram illustrating a communication unit of a power transmission unit and a communication unit of a rectifying and smoothing unit according to one exemplary embodiment. Each of FIGS. 17 and 18 is a diagram schematically illustrating a plasma processing apparatus according to yet another exemplary embodiment. As shown in FIGS. 6, 7, 16, 17, and 18, the communication unit 121 and the communication unit 151 may be configured to transmit signals such as the instruction signal described above between each other via wireless communication. The communication via wireless communication may be performed by optical communication. When the communication unit 121 and the communication unit 151 transmit signals therebetween via wireless communication, the communication unit 121 and the communication unit 151 may be disposed in any location as long as there is no shielding material interposed therebetween. According to the examples shown in these drawings, the RF filter 190 is not required. Further, in various exemplary embodiments, including the examples shown in FIGS. 16 to 18, the signal line 1250 may be a shielded cable covered with a shield at ground potential. In this connection, the plurality of signal lines constituting the signal line 1250 may be individually covered with a shield or may be collectively covered with a shield.

Figure 19:
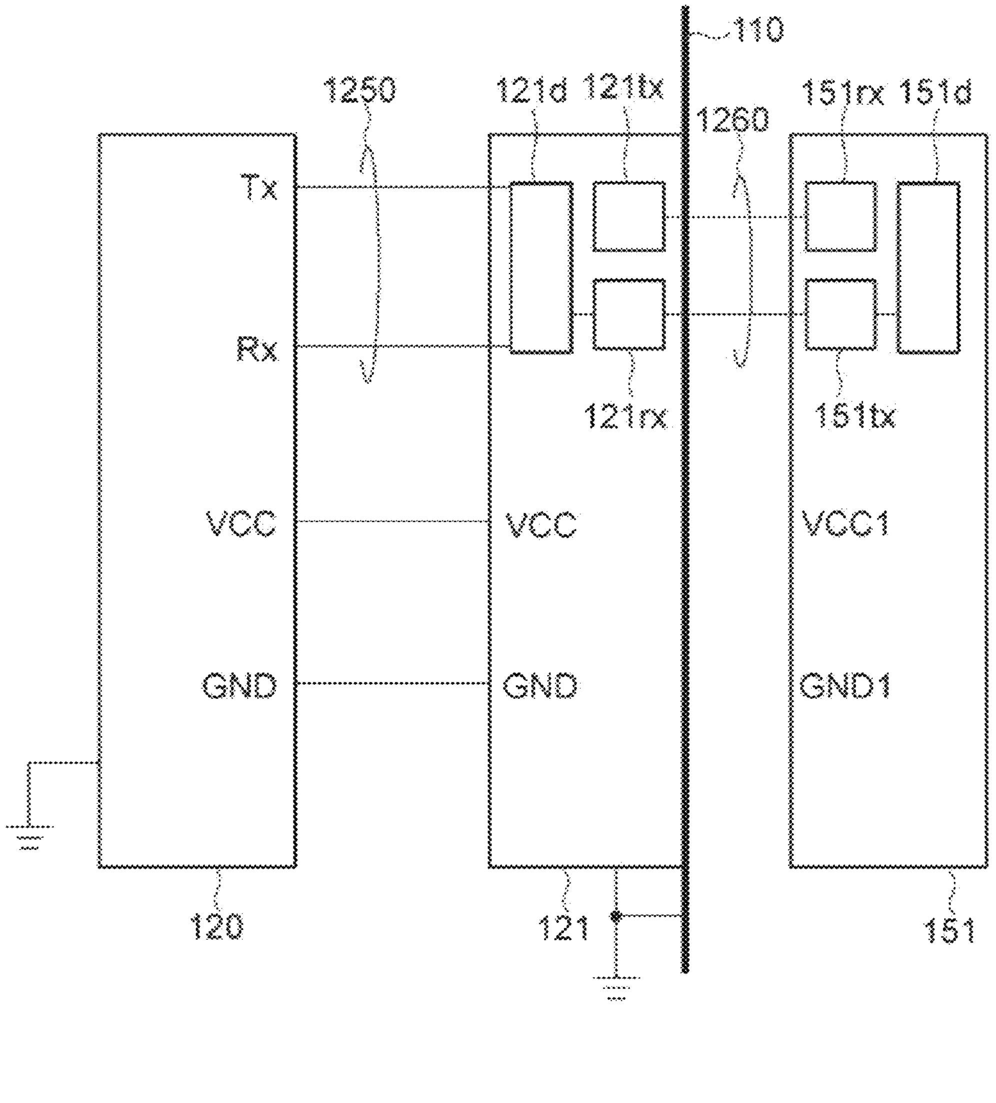
FIG. 19 is a diagram illustrating a communication unit of a power transmission unit and a communication unit of a rectifying and smoothing unit according to another exemplary embodiment.
Figure 20:
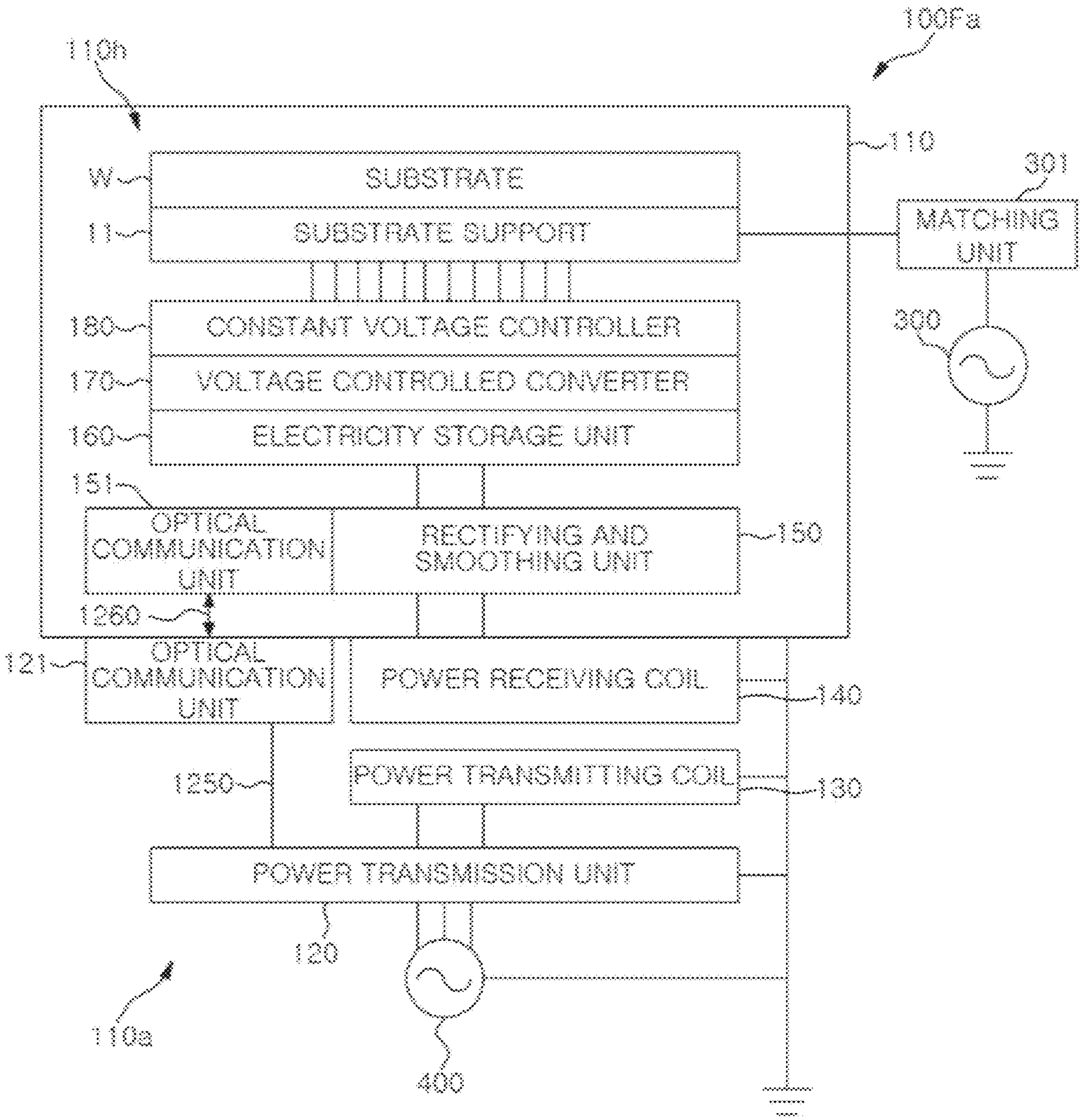
FIG. 20 is a diagram schematically illustrating a plasma processing apparatus according to yet another exemplary embodiment.
Figure 21:
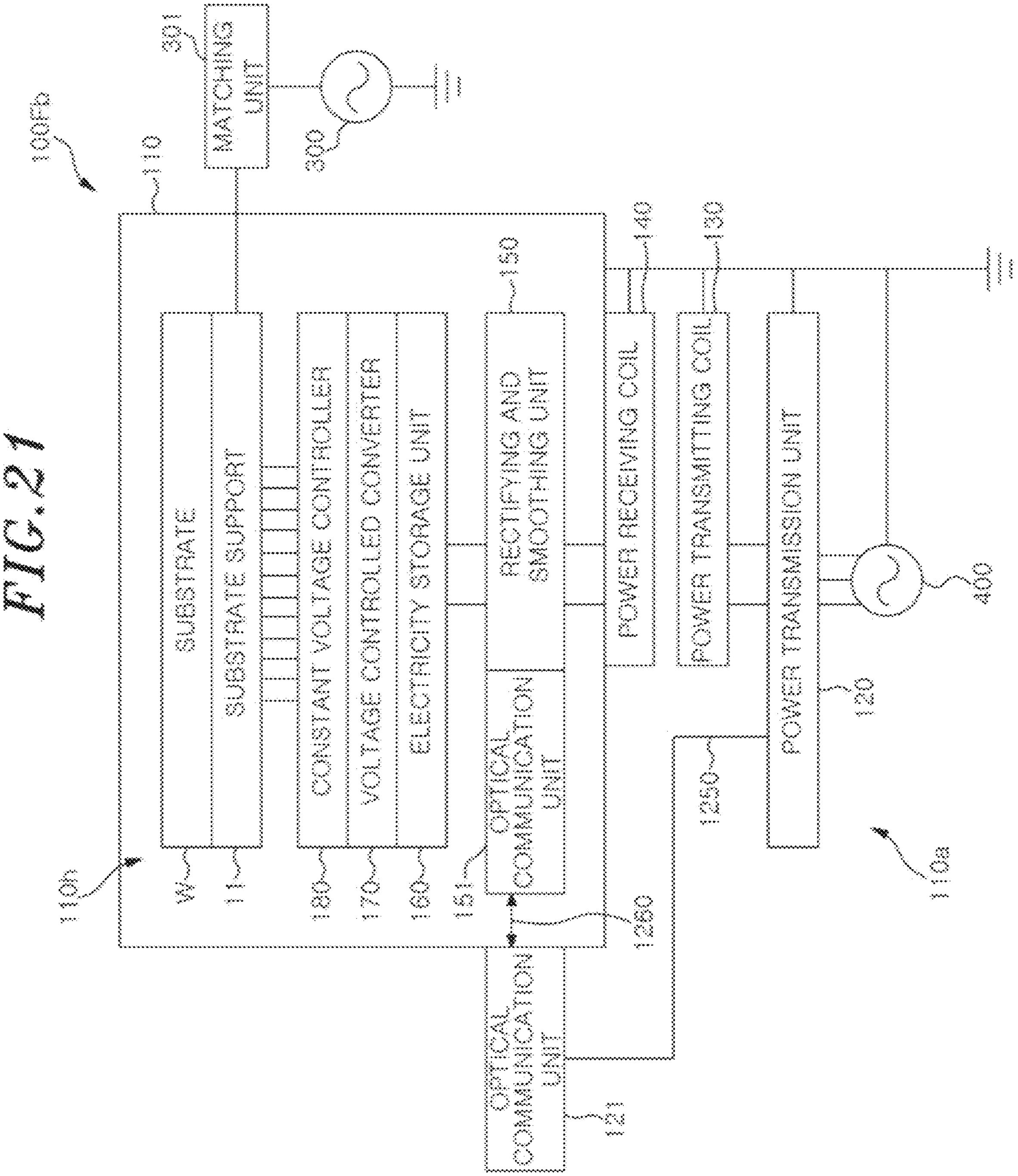
FIG. 21 is a diagram schematically illustrating a plasma processing apparatus according to yet another exemplary embodiment.
Figure 22:
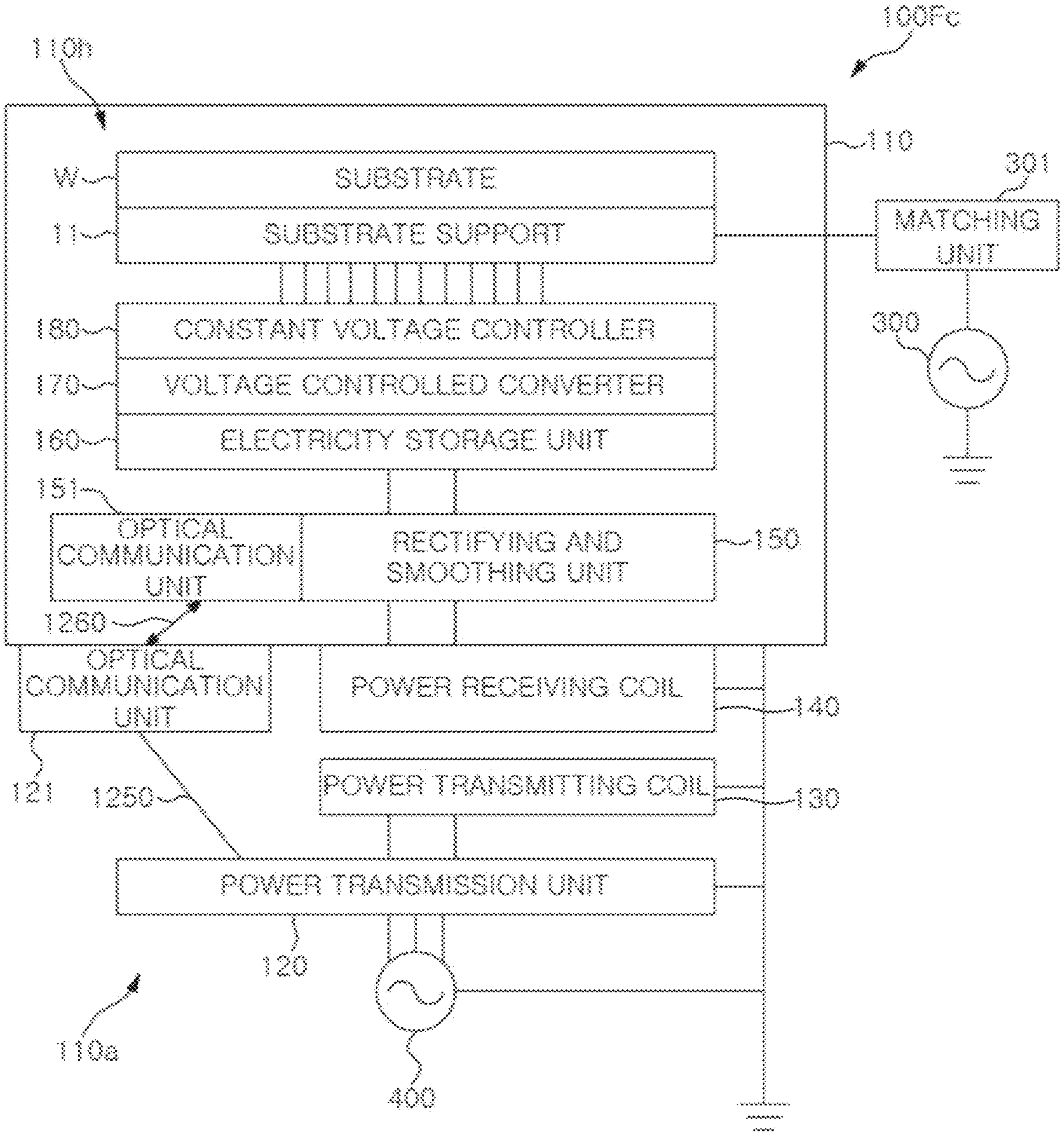
FIG. 22 is a diagram schematically illustrating a plasma processing apparatus according to yet another exemplary embodiment.

FIG. 19 is a diagram illustrating a communication unit of a power transmission unit and a communication unit of a rectifying and smoothing unit according to another exemplary embodiment. Each of FIGS. 20 to 22 is a diagram schematically illustrating a plasma processing apparatus according to yet another exemplary embodiment. As shown in FIGS. 19 to 22, the communication unit 121 and the communication unit 151 may be configured to transmit signals (optical signals) such as the above-mentioned instruction signal between each other via an optical fiber 1260, that is, by optical fiber communication. When the communication unit 121 and communication unit 151 transmit signals therebetween via the optical fiber 1260, the communication unit 121 and the communication unit 151 may be disposed in any location as long as the bending radius of the optical fiber 1260 falls within the allowable range. Also, in the examples shown in these drawings, the RF filter 190 becomes unnecessary.

[Electricity Storage Unit]

Each of FIGS. 23A and 23B is a diagram illustrating an electricity storage unit according to one exemplary embodiment. As shown in FIG. 23A, the electricity storage unit 160 includes a capacitor 161. The capacitor 161 is connected between the pair of power feeding lines, that is, the positive line 160*p* and the negative line 160*m*. The positive line 160*p* extends from the positive output ($V_{OUT+}$) of the rectifying and smoothing unit 150 toward a load. The negative line 160*m* extends from the negative output ($V_{OUT-}$) of the rectifying and smoothing unit 150 toward the load. The capacitor 161 may be a polarized capacitor. The capacitor 161 may be an electric double layer or lithium ion battery.

As shown in FIG. 23B, the electricity storage unit 160 may include a plurality of capacitors 161. The plurality of capacitors 161 are connected in series between the positive line 160*p* and the negative line 160*m*. The plurality of capacitors 161 may have the same capacitance or may have different capacitances. Each of the plurality of capacitors 161 may be a polarized capacitor. Each of the plurality of capacitors 161 may be an electric double layer or a lithium ion battery. The electricity storage unit 160 needs to be used under conditions in which a total value of the input voltage thereto and the line-to-line potential difference due to normal mode noise is lower than the allowable input voltage. When the electricity storage unit 160 includes the plurality of capacitors 161 connected in series, the allowable input voltage of the electricity storage unit 160 becomes high. Accordingly, according to the example shown in FIG. 23B, the noise resistance of the electricity storage unit 160 is improved.

[Voltage Controlled Converter]

FIG. 24 is a diagram illustrating a voltage control converter according to one exemplary embodiment. The voltage controlled converter 170 is a DC-DC converter. The voltage controlled converter 170 is connected between the electricity storage unit 160 and the constant voltage controller 180. The positive line 160*p* is connected to a positive input ($V_{IN+}$) of the voltage controlled converter 170. The negative line 160*m* is connected to a negative input ($V_{IN-}$) of the voltage controlled converter 170. The positive output ($V_{OUT+}$) of the voltage controlled converter 170 is connected to the positive input ($V_{IN+}$) of the constant voltage controller 180. The negative output ($V_{OUT-}$) of the voltage controlled converter 170 is connected to the negative input ($V_{IN-}$) of the constant voltage controller 180.

The voltage controlled converter 170 may include a controller 172, a low-pass filter 173, a transformer 174, and a capacitor 175. The low-pass filter 173 may include an inductor 1731*a*, a capacitor 1732*a*, and a capacitor 1732*b*. One end of the inductor 1731*a* is connected to the positive input ($V_{IN+}$) of the voltage controlled converter 170. The other end of the inductor 1731*a* is connected to one end of a primary coil of the transformer 174. One end of the capacitor 1732*a* is connected to one end of the inductor 1731*a* and the positive input ($V_{IN+}$) of the voltage controlled converter 170. The other end of the capacitor 1732*a* is connected to the negative input ($V_{IN-}$) of the voltage controlled converter 170. One end of the capacitor 1732*b* is connected to the other end of the inductor 1731*a*. The other end of the capacitor 1732*b* is connected to the negative input ($V_{IN-}$) of the voltage controlled converter 170.

The transformer 174 includes a primary coil 1741, a secondary coil 1742, and a switch 1743. The other end of the primary coil 1741 is connected to the negative input ($V_{IN-}$) of the voltage controlled converter 170 via the switch 1743. One end of the secondary coil 1742 is connected to one end of the capacitor 175 and the positive output ($V_{OUT+}$) of the voltage controlled converter 170. The other end of the secondary coil 1742 is connected to the other end of the capacitor 175 and the negative output ($V_{OUT-}$) of the voltage controlled converter 170.

A driver 1744 is connected to the switch 1743. The driver 1744 opens and closes the switch 1743. When the switch 1743 is closed, that is, when the other end of the primary coil 1741 and the negative input ($V_{IN-}$) are in a conductive state, the other end of the primary coil 1741 is connected to the negative input ($V_{IN-}$) of the voltage controlled converter 170, and DC power from the voltage controlled converter 170 is provided to the constant voltage controller 180. When the switch 1743 is open, that is, when the other end of the primary coil 1741 and the negative input ($V_{IN-}$) are in a non-conductive state, the connection between the other end of the primary coil 1741 and the negative input ($V_{IN-}$) of the voltage controlled converter 170 is cut off, and the supply of DC power from the voltage controlled converter 170 to the constant voltage controller 180 is shut off.

The voltage controlled converter 170 may further include a voltage detector 176*v* and a current detector 176*i*. The voltage detector 176*v* detects a voltage value across of the secondary coil 1742 or the voltage value between the positive output and the negative output of the voltage controlled converter 170. The current detector 176*i* measures a current value between the other end of the secondary coil 1742 and the negative output of the voltage controlled converter 170. The voltage value detected by the voltage detector 176*v* and the current value detected by the current detector 176*i* are provided to the controller 172. The controller 172 may be the same as or different from at least one of the controller 122 or the controller 152.

When the voltage value detected by the voltage detector 176*v* is equal to or higher than the threshold value, the controller 172 controls the driver 1744 to shut off the supply of DC power from the voltage controlled converter 170 to the constant voltage controller 180. The voltage value between the positive output and the negative output of the voltage controlled converter 170 is an added value of the output voltage value of the voltage controlled converter 170 and the line-to-line potential difference due to normal mode noise. In this embodiment, damage to the load of the voltage controlled converter 170 due to an overvoltage caused by the line-to-line potential difference due to normal mode noise may be suppressed.

[Constant Voltage Controller]

FIGS. 25 and 26 are referred. FIGS. 25 and 26 are diagrams illustrating a constant voltage controller according to some exemplary embodiments. The constant voltage controller 180 is connected between the electricity storage unit 160 and at least one power consuming member 240, and is configured to control the application of voltage (application of DC voltage) to at least one power consuming member 240 and the stopping of the application.

The constant voltage controller 180 includes a controller 182 and at least one switch 183. The positive input ($V_{IN+}$) of the constant voltage controller 180 is connected to the power consuming member 240 via the switch 183. The negative input ($V_{IN-}$) of the constant voltage controller 180 is connected to the power consuming member 240. The switch 183 is controlled by the controller 182. When the switch 183 is closed, the DC voltage from the constant voltage controller 180 is applied to the power consuming member 240. When the switch 183 is open, the application of DC voltage from the constant voltage controller 180 to the power consuming member 240 is stopped. Further, the controller 182 may be the same as or different from at least one of the controller 122, the controller 152, or the controller 172.

In the embodiment shown in FIGS. 25 and 26, the plasma processing apparatus includes a plurality of power consuming members 240. The constant voltage controller 180 includes the controller 182 and a plurality of switches 183. The positive input ($V_{IN+}$) of the constant voltage controller 180 is connected to the plurality of power consuming members 240 via the plurality of switches 183. The negative input ($V_{IN-}$) of the constant voltage controller 180 is connected to the plurality of power consuming members 240.

In the embodiment shown in FIGS. 25 and 26, the plurality of power consuming members 240 may include a plurality of heaters (resistive heating elements). The plurality of heaters may be provided within the substrate support 11. In the embodiment shown in FIG. 25, a plurality of resistors 260 are disposed adjacent to each of the plurality of heaters. Each of the plurality of resistors 260 has a resistance value that changes with temperature. Each of the plurality of resistors 260 is, for example, a thermistor. Each of the plurality of resistors 260 is connected in series with a reference resistor (not shown). The constant voltage controller 180 includes a plurality of measuring units 184. Each of the plurality of measuring units 184 applies a reference voltage to a series connection of a corresponding resistor among the plurality of resistors 260 and the reference resistor, and detects the voltage value across of the resistor. Each of the plurality of measuring units 184 notifies the controller 182 of the detected voltage value. The controller 182 specifies a target temperature of an area in which the corresponding heater among the plurality of heaters is disposed from the notified voltage value, and controls the application of DC voltage to the corresponding heater so as to bring the temperature of the area closer to the target temperature. Further, instead of the plurality of resistors 260, an optical fiber thermometer may be disposed. In this connection, wiring between the plurality of resistors 260 and the plurality of measuring units 184 is not required, so the influence of high frequency conductive noise on the power consuming member 240 may be eliminated.

In the embodiment shown in FIG. 26, the constant voltage controller 180 includes a voltage detector 185*v* and a plurality of current detectors 185*i*. The voltage detector 185*v* detects the voltage value applied to each of the plurality of heaters. The plurality of current detectors 185*i* measure the value of the current supplied to the corresponding one of the plurality of heaters, that is, the current value. The plurality of measuring units 184 specify the resistance value of the corresponding one of the plurality of heaters based on the current value detected by the corresponding one of the plurality of current detectors 185*i* and the voltage value detected by the voltage detector 185*v*. The controller 182 specifies a target temperature of each of a plurality of areas in which each of the plurality of heaters are disposed, based on the detected resistance value of each of the plurality of heaters. The controller 182 controls the application of DC voltage to each of the plurality of heaters so that the temperature of each of the plurality of areas approaches the target temperature.

[Sharing of Electricity Storage Unit in Multiple Plasma Processing Apparatuses]

FIG. 27 is a diagram illustrating a plasma processing system according to one exemplary embodiment. Each of FIGS. 28 to 33 is a diagram partially illustrating the configuration of a plasma processing system according to one exemplary embodiment. The plasma processing system (hereinafter referred to as "system PS") shown in FIGS. 27 to 33 includes a plurality of plasma processing apparatuses 100G. Hereinafter, the system PS will be described from the viewpoint of its differences between each of the plasma processing apparatuses 100G and the plasma processing apparatus 100E shown in FIG. 7.

In the example shown in FIG. 27, the system PS includes a plasma processing apparatus 100G1 (first plasma processing apparatus) and a plasma processing apparatus 100G2 (second plasma processing apparatus) as the plurality of plasma processing apparatuses 100G. The system PS may include three or more plasma processing apparatuses 100G.

In the system PS, each of the plurality of plasma processing apparatuses 100G may share the electricity storage unit 160 of another plasma processing apparatuses 100G. That is, each of the plasma processing apparatuses 100G is configured such that its electricity storage unit 160 and the electricity storage unit 160 of another plasma processing apparatus 100G may be connected in parallel with each of the one or more power consuming members 240.

Each of the plasma processing apparatuses 100G includes a pair of terminals Ta and Tb. The terminal Ta is connected to one (e.g., a positive line 160*p*) of a pair of power supply lines that connect the rectifying and smoothing unit 150 and the electricity storage unit 160 to each other. The terminal Tb is connected to the other (e.g., a negative line 160*m*) of a pair of power supply lines that connect the rectifying and smoothing unit 150 and the electricity storage unit 160 to each other.

The pair of terminals Ta and Tb are disposed in the non-reduced pressure space within the ground frame 110. The ground frame 110 has an opening 110*w* for exposing the pair of terminals Ta and Tb to the outside of the ground frame 110. By the opening 110*w*, it is possible to make access to the terminals Ta and Tb within the ground frame 110. The terminal Ta of each of the plasma processing apparatuses 100G is connected to the terminal Ta of another plasma processing apparatus 100G via a first wire extending through the opening 110*w*. The first wire is disposed at a distance equal to or greater than the insulating distance from the ground frame 110. The terminal Tb of each of the plasma processing apparatuses 100G is connected to the terminal Tb of another plasma processing apparatus among the plurality of plasma processing apparatuses 100G via a second wire extending through the openings 110*w*. Thereby, the electricity storage units 160 of the plasma processing apparatuses 100G are connected in parallel. The second wire is disposed away from the ground frame 110 by the insulating distance or more.

In one embodiment, the electricity storage units 160 of the plurality of plasma processing apparatuses 100G are connected in parallel via at least one backflow prevention switch 162, which is configured to switch the backflow direction of power allowed between them. In the examples shown in FIGS. 27 to 33, each of the plasma processing apparatus 100G1 and the plasma processing apparatus 100G2 includes the backflow prevention switch 162. The electricity storage unit 160 of the plasma processing apparatus 100G1 and the electricity storage unit 160 of the plasma processing apparatus 100G2 are connected in parallel via the backflow prevention switch 162 of the plasma processing apparatus 100G1 and the backflow prevention switch 162 of the plasma processing apparatus 100G2.

The backflow prevention switch 162 may be provided in the non-reduced pressure space of a corresponding one among the plurality of plasma processing apparatuses 100G. Alternatively, the backflow prevention switch 162 may be provided outside the ground frame 110 of each of the plasma processing apparatuses 100G. As shown in FIG. 29, each of the plasma processing apparatuses 100G may include the backflow prevention switch 162 in addition to the rectifying and smoothing unit 150. Alternatively, as shown in FIG. 30, the rectifying and smoothing unit 150 of each of the plasma processing apparatuses 100G may include the backflow prevention switch 162. That is, the backflow prevention switch 162 may be part of the rectifying and smoothing unit 150 and may be built in the rectifying and smoothing unit 150.

As shown in FIGS. 29 to 31, the backflow prevention switch 162 includes a terminal **162*a* and a terminal 162*b*. In the example of FIGS. 29 to 31, the terminal 162*a* is the terminal Ta. The terminal 162*b* is connected to one (e.g., the positive line 160*p*) of the pair of power supply lines that connect the rectifying and smoothing unit 150 and the electricity storage unit 160 to each other. The backflow prevention switch 162 is configured as a switch that may switch the connection between the terminal 162*a* and the terminal 162*b* among a connection via a diode 1621, a connection via a diode 1622, and a connection via an electrical path 1623. In the example of FIGS. 29 to 31, the terminals 162*a* and 162*b* of the backflow prevention switch 162 are connected to the positive line 160*p*, but the terminals 162*a* and 162*b* may be connected to the negative line 160*m*. Even when the terminals 162*a* and 162*b* are connected to the negative line 160*m*, the backflow prevention switch 162** performs the same switching operation as the switching operation described above.

The diode 1621 is provided in a direction to prevent the backflow of power from one (e.g., the electricity storage unit 160 of the plasma processing apparatus 100G1) of the two electricity storage units 160 connected in parallel with the other (e.g., the electricity storage unit 160 of the plasma processing apparatus 100G2). The diode 1622 is provided in a direction to prevent the backflow of power from one (e.g., the electricity storage unit 160 of the plasma processing apparatus 100G2) of the two electricity storage units 160 connected in parallel to the other (e.g., the electricity storage unit 160 of the plasma processing apparatus 100G1). The electrical path 1623 allows bidirectional power flow power between the two electricity storage units 160 connected in parallel. The electrical path 1623 does not include any diode.

In one embodiment, as shown in FIG. 29 or 30, the terminals **162*a* and 162*b* of the backflow prevention switch 162 of the plasma processing apparatus 100G1 may be connected to each other via the diode 1621. The terminals 162*a* and 162*b* of the backflow prevention switch 162 of the plasma processing apparatus 100G2 may be connected to each other via the electrical path 1623. In this case, the backflow of power from the electricity storage unit 160 of the plasma processing apparatus 100G1 to the electricity storage unit 160 of the plasma processing apparatus 100G2 is suppressed. In other words, the supply of power from the electricity storage unit 160 of the plasma processing apparatus 100G2 to the electricity storage unit 160 of the plasma processing apparatus 100G1 is permitted, but the supply of power from the electricity storage unit 160 of the plasma processing apparatus 100G1 to the electricity storage unit 160 of the plasma processing apparatus 100G2 is suppressed. In this embodiment, the plasma processing apparatus 100G1 is a master apparatus, whereas the plasma processing apparatus 100G2 is a slave apparatus. The embodiment in which the plasma processing apparatus 100G1 serves as the master apparatus and the plasma processing apparatus 100G2** serves as the slave apparatus may be used in the following first to third cases.

In the first case, the load fluctuation of the power consuming member of the plasma processing apparatus 100G1 is larger than the load fluctuation of the power consuming member of the plasma processing apparatus 100G2. According to a specific example of the first case, as shown in FIG. 28, in the plasma processing apparatus 100G2, the only power consuming member to which power is supplied from the electricity storage unit 160 is the power consuming member **240*b*. However, in the plasma processing apparatus 100G1, the power consuming member to which power is supplied from the electricity storage unit 160 may be switched from one to both of the power consuming member 240*a* and the power consuming member 240*c*, or vice versa. In such a case, a load fluctuation occurs in the plasma processing apparatus 100G1. When the load fluctuation occurs, the output voltage of the electricity storage unit 160 of the plasma processing apparatus 100G1 may fluctuate. However, in the embodiment shown in FIG. 29 or 30, since the electricity storage unit 160 of the plasma processing apparatus 100G2 is connected in parallel with the electricity storage unit 160 of the plasma processing apparatus 100G1, the combined capacitance of these electricity storage units 160 is large. Therefore, a fluctuation in the output voltage of the electricity storage unit 160 of the plasma processing apparatus 100G1** caused by the load fluctuation is suppressed.

In the second case, the power level of high frequency power, such as a first RF signal and/or a second RF signal, generated by the high frequency power supply 300 of the plasma processing apparatus 100G1 is greater than the power level of high frequency power generated by the high frequency power supply 300 of the plasma processing apparatus 100G2. Further, the third case is a case where the power output from the electricity storage unit 160 of the plasma processing apparatus 100G1 is greater than the power output from the electricity storage unit 160 of the plasma processing apparatus 100G2.

In another embodiment, as shown in FIG. 31, the terminals **162*a* and 162*b* of the backflow prevention switch 162 of the plasma processing apparatus 100G1 may be connected via the electrical path 1623. Further, the terminals 162*a* and 162*b* of the backflow prevention switch 162 of the plasma processing apparatus 100G2 may be connected via the electrical path 1623. In this embodiment, power may be supplied in both directions between the electricity storage unit 160 of the plasma processing apparatus 100G1 and the electricity storage unit 160 of the plasma processing apparatus 100G2. In this embodiment, since the electricity storage unit 160 of the plasma processing apparatus 100G1 and the electricity storage unit 160 of the plasma processing apparatus 100G2 are connected in parallel, the combined capacitance of these electricity storage units 160 is large. Therefore, the fluctuation in the output voltage of the electricity storage unit 160 of the plasma processing apparatus 100G1 caused by the load fluctuation is suppressed. In addition, the fluctuation in the output voltage of the electricity storage unit 160 of the plasma processing apparatus 100G2** caused by the load fluctuation is suppressed.

As shown in FIGS. 29 to 32, a pair of terminals Ta and Tb may be provided by the backflow prevention switch 162. In this case, the terminal Ta may be the terminal 162*a*. Alternatively, the backflow prevention switch 162 may be provided outside the ground frame 110, and the pair of terminals Ta and Tb may be provided in the non-reduced pressure space within the ground frame 110, as elements separate from the backflow prevention switch 162, as shown in FIG. 33. In this case, the pair of terminals Ta and Tb are connected to the backflow prevention switch 162 provided outside the ground frame 110.

In any embodiment, the pair of terminals Ta and Tb may be provided within the ground frame 110 at a distance from the ground frame 110 that is equal to or greater than the insulating distance. When the electricity storage unit 160 in each of the plasma processing apparatuses 100G is not connected in parallel with the electricity storage unit 160 of another plasma processing apparatus, the opening 110*w* is closed by a metallic shielding member 110*c* that may open or close the opening, as shown in FIGS. 32 and 33. When the opening 110*w* is closed by the shielding member 110*c*, the shielding member 110*c* and the ground frame 110 are electrically connected to each other. The shielding member 110*c* forms part of the ground frame 110.

FIG. 34 is a diagram illustrating a state in which an electricity storage unit in a plasma processing system according to one exemplary embodiment is charged. As shown in FIG. 34, the electricity storage unit 160 of each of the plurality of plasma processing apparatuses 100G may be charged by a DC stabilized power supply 500 disposed outside the ground frame 110 (i.e., in the space 110*a*). The DC stabilized power supply 500 is connected to a pair of terminals Ta and Tb via a pair of wires extending through the opening 110*w*.

FIG. 35 is a diagram illustrating a state in which the electricity storage unit in the plasma processing system according to one exemplary embodiment is discharged. As shown in FIG. 35, the power of the electricity storage unit 160 of each of the plurality of plasma processing apparatuses 100G may be discharged to a discharge load 600 disposed outside the ground frame 110 (i.e., in the space 110*a*). The discharge load 600 is connected to the pair of terminals Ta and Tb via the pair of wires extending through the opening 110*w*. One of the wires may be connected to the discharge load 600 via a switch 610. The discharge load 600 may be provided with a fan 602 to cool the discharge load.

FIG. 36 is a timing chart related to the discharging of the electricity storage unit in the plasma processing system according to one exemplary embodiment. As shown in FIG. 36, during the discharging of the electricity storage unit 160, the voltage value of the electricity storage unit 160 decreases from a voltage value Vs at the start of discharging of the electricity storage unit 160. The discharging of the electricity storage unit 160 is completed and stopped at time tr when the voltage value of the electricity storage unit 160 reaches a threshold value VTH. The threshold value VTH is set to, for example, a value at which the controller 152 may not be activated and at which there is no effect on the human body. The threshold value VTH may be set to, for example, 2.5V.

FIG. 37 is a diagram illustrating a plasma processing system according to another exemplary embodiment. The system PS shown in FIG. 37 includes a plasma processing apparatus 100G1, a plasma processing apparatus 100G2, and a plasma processing apparatus 100G3. An electricity storage unit 160 of the plasma processing apparatus 100G1, an electricity storage unit 160 of the plasma processing apparatus 100G2, and an electricity storage unit 160 of the plasma processing apparatus 100G3 are connected in parallel with each other.

The electricity storage unit 160 of the plasma processing apparatus 100G1 is connected in parallel with the electricity storage unit 160 of the plasma processing apparatus 100G2 through a backflow prevention switch 162B of the plasma processing apparatus 100G1 and a backflow prevention switch 162A of the plasma processing apparatus 100G2. The electricity storage unit 160 of the plasma processing apparatus 100G2 is connected in parallel with the electricity storage unit 160 of the plasma processing apparatus 100G3 through a backflow prevention switch 162B of the plasma processing apparatus 100G2 and a backflow prevention switch 162A of the plasma processing apparatus 100G3. The backflow prevention switch 162B is further connected to the electricity storage unit 160 of the plasma processing apparatus 100G3. The backflow prevention switch 162A and the backflow prevention switch 162B in each of the plasma processing apparatus 100G1, the plasma processing apparatus 100G2, and the plasma processing apparatus 100G3 are configured in the same manner as the above-described backflow prevention switch 162.

In the system PS shown in FIG. 37, a discharge load 600 may be connected to a pair of terminals Ta and Tb of the backflow prevention switch 162B of the plasma processing apparatus 100G3 via a pair of wires extending through the opening 110*w*. In this case, in the backflow prevention switch 162A and the backflow prevention switch 162B in each of the plasma processing apparatuses 100G1, 100G2, and 100G3, the connection between the terminal 162*a* and the terminal 162*b* is set to allow the flow of power from the electricity storage unit 160 of each of the plasma processing apparatuses to the discharge load 600. This allows the electricity storage units 160 of the plasma processing apparatuses 100G1, 100G2, and 100G3 to be discharged simultaneously to a single discharge load 600.

Further, in the system PS shown in FIG. 37, a DC stabilized power supply 500 may be connected to the pair of terminals Ta and Tb of the backflow prevention switch 162B of the plasma processing apparatus 100G3 via the pair of wires extending through the opening 110*w*. In this case, in the backflow prevention switch 162A and the backflow prevention switch 162B in each of the plasma processing apparatuses 100G1, 100G2, and 100G3, the connection between the terminal 162*a* and the terminal 162*b* is set to allow the flow of power from the DC stabilized power supply 500 to the plasma processing apparatus. This allows the electricity storage units 160 of the plasma processing apparatuses 100G1, 100G2, and 100G3 to be charged simultaneously by a single DC stabilized power supply 500.

Although various exemplary embodiments have been described above, various additions, omissions, substitutions, and modifications may be made without being limited to the above-described exemplary embodiments. In addition, elements from different embodiments may be combined to form other embodiments.

Herein, various exemplary embodiments included in the present disclosure are described in [E1] to [E10] below.

[E1]

A plasma processing apparatus comprising:

a first plasma processing apparatus; and a second plasma processing apparatus, wherein each of the first plasma processing apparatus and the second plasma processing apparatus comprises:

a plasma processing chamber;

a substrate support disposed within the plasma processing chamber;

a high frequency power supply configured to generate high frequency power;

an electrode or an antenna electrically connected to the high frequency power supply to receive the high frequency power for generating plasma from gas within the plasma processing chamber;

a power consuming member disposed within the plasma processing chamber or the substrate support;

a ground frame grounded and surrounding the substrate support together with the plasma processing chamber;

an electricity storage unit disposed within a space surrounded by the ground frame and electrically connected to the power consuming member;

a power receiving coil electrically connected to the electricity storage unit and capable of receiving power from a power transmitting coil by electromagnetic induction coupling; and a rectifying and smoothing unit disposed within the space surrounded by the ground frame, and comprising a rectifying circuit connected to the power receiving coil, and a smoothing circuit connected between the rectifying circuit and the electricity storage unit, and wherein each of the first plasma processing apparatus and the second plasma processing apparatus is configured such that, with respect to the power consuming member thereof, the electricity storage unit thereof and the electricity storage unit of a remaining one of the first plasma processing apparatus and the second plasma processing apparatus are connectable in parallel.

[E2]

The plasma processing apparatus of E1, wherein one of the first plasma processing apparatus and the second plasma processing apparatus or each of the first plasma processing apparatus and the second plasma processing apparatus further comprises a backflow prevention switch configured to switch a backflow direction of power allowed between the electricity storage unit thereof and the electricity storage unit of a remaining plasma processing apparatus.

[E3]

The plasma processing apparatus of E2, wherein the backflow prevention switch is configured to selectively switch a connection between the electricity storage unit of the first plasma processing apparatus and the electricity storage unit of the second plasma processing apparatus among a connection via a first diode provided to prevent a backflow of power from the electricity storage unit of the first plasma processing apparatus to the electricity storage unit of the second plasma processing apparatus, a connection via a second diode provided to prevent a backflow of power from the electricity storage unit of the second plasma processing apparatus to the electricity storage unit of the first plasma processing apparatus, and a connection via an electrical path that allows a bidirectional power flow between the electricity storage unit of the first plasma processing apparatus and the electricity storage unit of the second plasma processing apparatus.

[E4]

The plasma processing apparatus of E2 or E3, wherein each of the first plasma processing apparatus and the second plasma processing apparatus comprises the backflow prevention switch separately from the rectifying and smoothing unit.

[E5]

The plasma processing apparatus of E2 or E3, wherein the rectifying and smoothing unit of each of the first plasma processing apparatus and the second plasma processing apparatus comprises the backflow prevention switch.

[E6]

The plasma processing apparatus of any one of E2 to E5, wherein, when a load fluctuation of the power consuming member of the first plasma processing apparatus is larger than a load fluctuation of the power consuming member of the second plasma processing apparatus, the backflow prevention switch is set to prevent a backflow from the electricity storage unit of the first plasma processing apparatus to the electricity storage unit of the second plasma processing apparatus.

[E7]

The plasma processing apparatus of any one of E2 to E5, wherein, when a power level of the high frequency power generated by the high frequency power supply of the first plasma processing apparatus is larger than a power level of the high frequency power generated by the high frequency power supply of the second plasma processing apparatus, the backflow prevention switch is set to prevent a backflow from the electricity storage unit of the first plasma processing apparatus to the electricity storage unit of the second plasma processing apparatus.

[E8]

The plasma processing apparatus of any one of E2 to E5, wherein, when power output from the electricity storage unit of the first plasma processing apparatus is larger than power output from the electricity storage unit of the second plasma processing apparatus, the backflow prevention switch is set to prevent a backflow from the electricity storage unit of the first plasma processing apparatus to the electricity storage unit of the second plasma processing apparatus.

[E9]

The plasma processing apparatus of any one of E1 to E8, wherein each of the first plasma processing apparatus and the second plasma processing apparatus comprises a pair of terminals provided within the ground frame at an insulating distance or more from the ground frame so as to connect the electricity storage unit thereof and the electricity storage unit of a remaining plasma processing apparatus in parallel.

[E10]

The plasma processing apparatus of E9, wherein the ground frame of each of the first plasma processing apparatus and the second plasma processing apparatus comprises:

an opening for exposing the pair of terminals to the outside of the ground frame; and a metallic shielding member configured to open and close the opening.

From the foregoing, it will be understood that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A plasma processing system comprising:

a first plasma processing apparatus; and a second plasma processing apparatus, wherein each of the first plasma processing apparatus and the second plasma processing apparatus comprises:

a plasma processing chamber;

a substrate support disposed within the plasma processing chamber;

a high frequency power supply configured to generate high frequency power;

an electrode or an antenna electrically connected to the high frequency power supply to receive the high frequency power for generating plasma from gas within the plasma processing chamber;

a power consuming member disposed within the plasma processing chamber or the substrate support;

a ground frame that, together with the plasma processing chamber, surrounds the substrate support, the ground frame being grounded;

an electricity storage unit disposed within a space surrounded by the ground frame and electrically connected to the power consuming member;

a power receiving coil electrically connected to the electricity storage unit and capable of receiving power from a power transmitting coil by electromagnetic induction coupling; and a rectifying and smoothing unit disposed within the space surrounded by the ground frame, and comprising a rectifying circuit connected to the power receiving coil, and a smoothing circuit connected between the rectifying circuit and the electricity storage unit, and wherein each of the first plasma processing apparatus and the second plasma processing apparatus is configured such that, with respect to the power consuming member thereof, the electricity storage unit thereof and the electricity storage unit of the other one of the first plasma processing apparatus and the second plasma processing apparatus are connectable in parallel.

2. The plasma processing system of claim 1, wherein at least one of the first plasma processing apparatus and the second plasma processing apparatus further comprises a backflow prevention switch configured to switch a backflow direction of power allowed between the electricity storage unit thereof and the electricity storage unit of the other plasma processing apparatus.

3. The plasma processing system of claim 2, wherein the backflow prevention switch is configured to selectively switch a connection between the electricity storage unit of the first plasma processing apparatus and the electricity storage unit of the second plasma processing apparatus among a connection via a first diode provided to prevent a backflow of power from the electricity storage unit of the first plasma processing apparatus to the electricity storage unit of the second plasma processing apparatus, a connection via a second diode provided to prevent a backflow of power from the electricity storage unit of the second plasma processing apparatus to the electricity storage unit of the first plasma processing apparatus, and a connection via an electrical path that allows a bidirectional power flow between the electricity storage unit of the first plasma processing apparatus and the electricity storage unit of the second plasma processing apparatus.

4. The plasma processing system of claim 2, wherein each of the first plasma processing apparatus and the second plasma processing apparatus comprises the backflow prevention switch separately from the rectifying and smoothing unit.

5. The plasma processing system of claim 2, wherein the rectifying and smoothing unit of each of the first plasma processing apparatus and the second plasma processing apparatus comprises the backflow prevention switch.

6. The plasma processing system of claim 2, wherein, when a load fluctuation of the power consuming member of the first plasma processing apparatus is larger than a load fluctuation of the power consuming member of the second plasma processing apparatus, the backflow prevention switch is set to prevent a backflow from the electricity storage unit of the first plasma processing apparatus to the electricity storage unit of the second plasma processing apparatus.

7. The plasma processing system of claim 2, wherein, when a power level of the high frequency power generated by the high frequency power supply of the first plasma processing apparatus is larger than a power level of the high frequency power generated by the high frequency power supply of the second plasma processing apparatus, the backflow prevention switch is set to prevent a backflow from the electricity storage unit of the first plasma processing apparatus to the electricity storage unit of the second plasma processing apparatus.

8. The plasma processing system of claim 2, wherein, when power output from the electricity storage unit of the first plasma processing apparatus is larger than power output from the electricity storage unit of the second plasma processing apparatus, the backflow prevention switch is set to prevent a backflow from the electricity storage unit of the first plasma processing apparatus to the electricity storage unit of the second plasma processing apparatus.

9. The plasma processing system of claim 1, wherein each of the first plasma processing apparatus and the second plasma processing apparatus comprises a pair of terminals provided within the ground frame at an insulating distance or more from the ground frame so as to connect the electricity storage unit thereof and the electricity storage unit of the other plasma processing apparatus in parallel.

10. The plasma processing system of claim 9, wherein the ground frame of each of the first plasma processing apparatus and the second plasma processing apparatus comprises:

an opening for exposing the pair of terminals to the outside of the ground frame; and a metallic shielding member configured to open and close the opening.

* * * * *